(12) United States Patent
Noh et al.

(10) Patent No.: US 8,623,583 B2
(45) Date of Patent: Jan. 7, 2014

(54) LASER INDUCED THERMAL IMAGING APPARATUS AND FABRICATING METHOD OF ORGANIC LIGHT EMITTING DIODE USING THE SAME

(71) Applicants: Sok Won Noh, Yongin-si (KR); Seong Taek Lee, Yongin-si (KR); Mu Hyun Kim, Yongin-si (KR); Myung Won Song, Yongin-si (KR); Sun Hoe Kim, Yongin-si (KR); Jin Wook Seong, Yongin-si (KR)

(72) Inventors: Sok Won Noh, Yongin-si (KR); Seong Taek Lee, Yongin-si (KR); Mu Hyun Kim, Yongin-si (KR); Myung Won Song, Yongin-si (KR); Sun Hoe Kim, Yongin-si (KR); Jin Wook Seong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/928,270

(22) Filed: Jun. 26, 2013

(65) Prior Publication Data

US 2013/0288415 A1    Oct. 31, 2013

Related U.S. Application Data

(62) Division of application No. 12/882,178, filed on Sep. 14, 2010, now Pat. No. 8,537,185, which is a division of application No. 11/507,792, filed on Aug. 21, 2006, now Pat. No. 7,817,175.

(30) Foreign Application Priority Data

Aug. 30, 2005  (KR) .................. 10-2005-0080341
Aug. 30, 2005  (KR) .................. 10-2005-0080342
Aug. 30, 2005  (KR) .................. 10-2005-0080343
Aug. 30, 2005  (KR) .................. 10-2005-0080344
Aug. 30, 2005  (KR) .................. 10-2005-0080345
Aug. 30, 2005  (KR) .................. 10-2005-0080346

(51) Int. Cl.
*G03F 1/00*   (2012.01)
*B41J 2/32*   (2006.01)
*G01D 15/14*  (2006.01)
*G03C 8/00*   (2006.01)

(52) U.S. Cl.
USPC ............... 430/199; 430/7; 347/171; 347/222; 347/224; 347/225

(58) Field of Classification Search
USPC ............... 430/270.1, 199, 200; 347/171, 222, 347/224, 225, 228, 239, 245, 263
See application file for complete search history.

(56) References Cited

U.S. PATENT DOCUMENTS

| | | |
|---|---|---|
| 3,927,943 A | 12/1975 | Pohl et al. |
| 4,377,339 A | 3/1983 | Coppock |
| 4,500,803 A | 2/1985 | Hayes |
| 4,975,637 A | 12/1990 | Frankeny et al. |
| 5,182,003 A | 1/1993 | Maass et al. |
| 5,248,990 A | 9/1993 | Ishikawa et al. |
| 5,725,979 A | 3/1998 | Julich |
| 5,937,272 A | 8/1999 | Tang |
| 6,057,067 A | 5/2000 | Isberg et al. |
| 6,270,934 B1 | 8/2001 | Chang et al. |
| 6,509,142 B2 | 1/2003 | Baxter et al. |
| 6,649,286 B2 | 11/2003 | Kim et al. |
| 6,666,541 B2 | 12/2003 | Ellson et al. |
| 6,688,365 B2 | 2/2004 | Tyan et al. |
| 6,695,029 B2 | 2/2004 | Phillips et al. |
| 6,911,667 B2 | 6/2005 | Pichler et al. |
| 6,939,649 B2 | 9/2005 | Hotta et al. |
| 7,217,334 B2 | 5/2007 | Toyoda |
| 7,233,101 B2 | 6/2007 | Jin |
| 7,396,631 B2 | 7/2008 | Wright et al. |
| 7,502,043 B2 | 3/2009 | Noh et al. |
| 7,817,175 B2 | 10/2010 | Noh et al. |
| 2002/0030440 A1 | 3/2002 | Yamazaki |
| 2003/0042849 A1 | 3/2003 | Ogino |
| 2003/0207500 A1 | 11/2003 | Pichler et al. |
| 2005/0007442 A1 | 1/2005 | Kay et al. |
| 2005/0048295 A1 | 3/2005 | Kim et al. |
| 2005/0087289 A1 | 4/2005 | Toyoda |

| | | | |
|---|---|---|---|
| 2005/0133802 | A1 | 6/2005 | Lee et al. |
| 2005/0153472 | A1 | 7/2005 | Yotsuya |
| 2005/0181587 | A1 | 8/2005 | Duan et al. |
| 2006/0011136 | A1 | 1/2006 | Yamazaki et al. |
| 2006/0063096 | A1 | 3/2006 | Lee et al. |
| 2007/0006807 | A1 | 1/2007 | Manz |
| 2007/0009671 | A1 | 1/2007 | Manz |
| 2007/0046770 | A1 | 3/2007 | Noh et al. |

FOREIGN PATENT DOCUMENTS

| | | |
|---|---|---|
| CN | 1591108 A | 3/2005 |
| CN | 1636760 A | 7/2005 |
| CN | 1638543 A | 7/2005 |
| EP | 0 749 847 A1 | 12/1996 |
| EP | 0 790 138 A1 | 8/1997 |
| EP | 1 538 004 A1 | 6/2005 |
| JP | 61-273968 A | 12/1986 |
| JP | 05-138959 | 6/1993 |
| JP | 08-123000 | 5/1996 |
| JP | 09-155720 | 6/1997 |
| JP | 09-167684 | 6/1997 |
| JP | 10-039791 | 2/1998 |
| JP | 10-41069 | 2/1998 |
| JP | 10-055888 | 2/1998 |
| JP | 11-054275 | 2/1999 |
| JP | 11-158605 | 6/1999 |
| JP | 2000-096211 | 4/2000 |
| JP | 2002-075636 | 3/2002 |
| JP | 2002-198174 | 7/2002 |
| JP | 2002-260921 | 9/2002 |
| JP | 2003-076297 | 3/2003 |
| JP | 2003-077658 | 3/2003 |
| JP | 2003-187972 | 7/2003 |
| JP | 2003-187973 | 7/2003 |
| JP | 2003-197372 | 7/2003 |
| JP | 2004-079540 | 3/2004 |
| JP | 2004-087143 | 3/2004 |
| JP | 2004-296224 | 10/2004 |
| JP | 2004-355949 | 12/2004 |
| JP | 2005-005245 | 1/2005 |
| JP | 2005-058911 | 3/2005 |
| JP | 2005-062356 | 3/2005 |
| JP | 2005-081299 | 3/2005 |
| JP | 2005-085799 | 3/2005 |
| JP | 2005-183381 | 7/2005 |
| TW | 369483 | 9/1999 |
| TW | 418336 | 1/2001 |

OTHER PUBLICATIONS

Japanese Office action dated Jul. 13, 2010, for corresponding Japanese Patent application 2006-234478.
Japanese Office action dated Jun. 2, 2009, for corresponding Japanese application 2006-234478.
Japanese Office action dated May 31, 2011, for Japanese Patent application 2006-061367.
Taiwan Office action dated Jul. 28, 2009, for corresponding Taiwan application 095131945.
SIPO Office action dated May 9, 2008, with English translation, for Chinese Patent application 200610142214.8.
SIPO Office action dated Nov. 7, 2008, with English translation of text, for Chinese Patent application 200610136937.6.
Japanese Office action dated Mar. 24, 2009, for Japanese Patent application 2006-061367.
Japanese Office action dated May 12, 2009, for Japanese Patent application 2006-080211.
Japanese Office action dated Aug. 25, 2009, for Japanese Patent application 2006-061329.
Taiwanese Office action dated Jul. 28, 2008, for Taiwanese Patent application 095131694.
Taiwan Office action dated Mar. 9, 2010, for Taiwanese Patent application 09920191480, with English translation.
U.S. Office action dated Sep. 19, 2008, for related U.S. Appl. No. 11/508,159 (now issued as U.S. Patent 7,502,043).
Sep. 29, 2008 response to U.S. Office action dated Sep. 29, 2008, for related U.S. Appl. No. 11/508,159 (now issued as U.S. Patent 7,502,043).
U.S. Office action dated Feb. 8, 2008, for related U.S. Appl. No. 11/512,991.
U.S. Office action dated Feb. 13, 2008, for cross-reference U.S. Appl. No. 11/509,463.
U.S. Office action dated Aug. 20, 2008, for related U.S. Appl. No. 11/509,463.
U.S. Office action dated Nov. 28, 2008, for related U.S. Appl. No. 11/512,991.
U.S. Office action dated Feb. 23, 2009, for related U.S. Appl. No. 11/509,463.
U.S. Office action dated May 18, 2009, for related U.S. Appl. No. 11/507,792.
U.S. Office action dated May 21, 2009, for related U.S. Appl. No. 11/509,463.
U.S. Office action dated Jun. 18, 2009, for related U.S. Appl. No. 11/510,372.
U.S. Office action dated Mar. 8, 2010, for related U.S. Appl. No. 11/507,792.
U.S. Office action dated Dec. 7, 2010, for cross reference U.S. Appl. No. 11/512,570.
U.S. Notice of Allowance dated Dec. 13, 2011, for cross reference U.S. Appl. No. 13/105,835.
Lee, Seong Taek et al., 21.3: *A New Patterning Method for Full-Color Polymer Light-Emitting Devices: Laser Induced Thermal Imaging (LITI)*; SID 02 Digest, 4pp., (2002).
Lee, Seong Taek et al., 29.3: *A Novel Patterning Method for Full-Color Organic Light-Emitting Devices: Laser Induced Thermal Imaging (LITI)*; SID 00 Digest, 4pp., (2002).
Niko et al., "*White light and RGB electroluminescence by light color-conversion*", 1998, Materials Physics and Devices for Molecular Electronics and Photonics, vol. 9, (1998) pp. 188-191.
Taiwan Office action dated Mar. 26, 2010 for Taiwanese application 095138004, with English translation, 7pp.

*Primary Examiner* — Amanda C. Walke

(74) *Attorney, Agent, or Firm* — Christie, Parker & Hale, LLP

(57) ABSTRACT

A laser induced thermal imaging apparatus and a fabricating method of organic light emitting diodes using the same, which laminate an acceptor substrate and a donor film using a magnetic force in vacuum, and are used to form a pixel array on the acceptor substrate. A substrate stage includes a magnet or magnetic substance. The acceptor substrate has a pixel region for forming first, second, and third sub-pixels, and the donor film has an organic light emission layer to be transferred to the pixel region. A laser oscillator irradiates a laser to the donor film. A contact frame is adapted to be disposed between the substrate stage and the laser oscillator, and is used to form a magnetic force with the substrate stage. The contact frame includes an opening through which the laser passes. A contact frame feed mechanism moves the contact frame in a direction of the substrate stage.

5 Claims, 24 Drawing Sheets

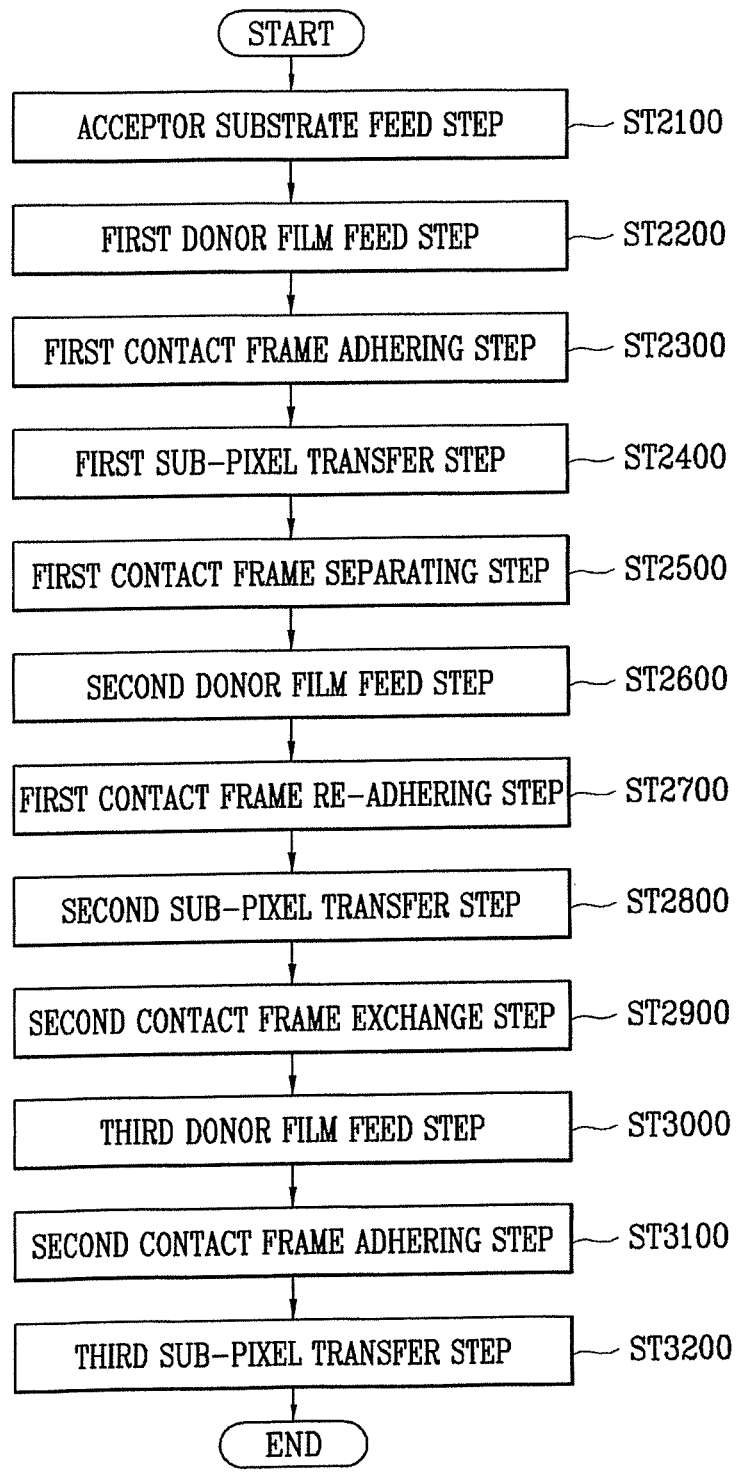

LASER INDUCED THERMAL IMAGING APPARATUS AND FABRICATING METHOD OF ORGANIC LIGHT EMITTING DIODE USING THE SAME

CROSS-REFERENCE TO RELATED APPLICATIONS

This application is a divisional of U.S. patent application Ser. No. 12/882,178, filed Sep. 14, 2010, which is a divisional of U.S. patent application Ser. No. 11/507,792, filed Aug. 21, 2006 which claims the benefit of and priority to Korean Patent Application Nos. 10-2005-0080341, 10-2005-0080342, 10-2005-0080343, 10-2005-0080344, 10-2005-0080345, and 10-2005-0080346, all filed on Aug. 30, 2005 in the Korean Intellectual Property Office, the entire contents of all of which are incorporated herein by reference.

BACKGROUND

1. Field of the Invention

The present invention relates to a laser induced thermal imaging apparatus and a fabricating method of an organic light emitting diode using the same, and more particularly to a laser induced thermal imaging apparatus and a fabricating method of an organic light emitting diode using the same, which laminate a donor film and an acceptor substrate using magnetic force.

2. Discussion of Related Art

An organic light emitting device includes a light emitting layer formed between the first and second electrodes, and emits light when a voltage is applied between the electrodes. A laser induced thermal imaging (LITI) process may be used to fabricated the organic light emitting device.

In general, at least a laser, an acceptor substrate and a donor substrate (or donor film) are needed for the laser induced thermal imaging. In a laser induced thermal imaging method, the laser is radiated to a donor substrate including a base substrate, a light-to-heat conversion layer (LTHC) and a transfer layer (or imaging layer) to convert the laser that passes through the base substrate into heat at the light-to-heat conversion layer, such that the light-to-heat conversion layer is deformed and expanded. This way, the transfer layer adjacent to the light-to-heat conversion layer is also deformed and expanded, and transferred to (or imaged on) the acceptor substrate.

When performing the laser induced thermal imaging method, a chamber in which the transfer is performed typically becomes a vacuum state. However, in the prior art, there has been a problem in that the transfer layer is not transferred well because space (or a gap) or impurities are created between the donor substrate and the accepter substrate when a laser-to-heat conversion is performed in the vacuum state. Therefore, in the laser induced thermal imaging method, a method of laminating the donor and accepter substrates is important, and to resolve the problems with the space or the impurities, various methods have been investigated.

FIG. 1 is a cross-sectional view that shows a prior art laser induced thermal imaging apparatus 10 for resolving the above-mentioned problem. According to FIG. 1, the laser induced thermal imaging apparatus 10 includes a substrate stage 12 placed in a chamber 11 and a laser radiating apparatus 13 placed at an upper portion of the chamber 11. The substrate stage 12 is a stage for placing an accepter substrate 14 and a donor film 15 introduced in the chamber 11 in turn.

The acceptor substrate 14 and the donor film 15 are laminated to each other prior to transferring the transfer layer of the donor film 15 to the acceptor substrate 14. During lamination, the chamber 11 is typically not maintained in the vacuum state, but a vacuum pump P is used to absorb impurities. Since the chamber is not in a vacuum state during lamination, the reliability or the lifetime of the resulting organic light emitting device can be reduced because of oxygen, moisture, or the like in the chamber 11.

On the other hand, when the chamber 11 is maintained in the vacuum state during lamination, it is difficult to absolutely prevent creation of impurities 1 and space between the accepter substrate 14 and the donor film 15.

SUMMARY OF THE INVENTION

Accordingly, it is an aspect of the present invention to provide a laser induced thermal imaging apparatus and a fabricating method of organic light emitting diodes using the same, which laminate an acceptor substrate and a donor film using a magnetic force in a vacuum state, and are used for forming a pixel array on the acceptor substrate.

The foregoing and/or other aspects of the present invention are achieved by providing a laser induced thermal imaging apparatus including: a substrate stage including a magnet or magnetic substance, the acceptor substrate and a donor film being sequentially fed and laminated on the substrate stage, the acceptor substrate having a pixel definition region in which first, second, and third sub-pixels are formed in a stripe pattern, the donor film having an organic light emission layer to be transferred on the pixel definition region; a laser oscillator for irradiating a laser to the donor film; a contact frame adapted to be disposed between the substrate stage and the laser oscillator for forming a magnetic force with the substrate stage, and including an opening through which the laser passes; and a contact frame feed mechanism for moving the contact frame in a direction of the substrate stage.

According to another aspect of a first embodiment of the present invention, there is provided a method for fabricating an organic light emitting diode having an emission layer formed between electrodes by the laser induced thermal imaging apparatus, the method including: placing an acceptor substrate having a pixel definition region in which first, second, and third sub-pixels are formed in a stripe pattern, on a substrate stage having a magnet; placing a donor film having an organic light emission layer to be transferred on the pixel definition region, on the acceptor substrate; adhering a first contact frame to a first donor film using magnetic attraction, the first contact frame having a magnet, a first opening being formed at the first contact frame, a laser for transferring a first color organic light emission layer passing through the opening; irradiating the laser to the first donor film through the first opening of the first contact frame to transfer the first color organic light emission layer to a first sub-pixel region; separating the first contact frame from the first donor film; placing a second donor film having a second color organic light emission layer on the acceptor substrate in place of the first donor film; adhering a second contact frame to a second donor film using magnetic attraction, the second contact frame having a magnet, a second opening being formed at the second contact frame, a laser for transferring a second color organic light emission layer passing through the second opening; irradiating the laser to the second donor film through the second opening of the second contact frame to transfer the second color organic light emission layer to a second sub-pixel region; separating the second contact frame from the second donor film; placing a third donor film having a third color organic light emission layer on the acceptor substrate in place of the second donor film; adhering a third contact frame to a third donor film using magnetic attraction, the third contact frame having a magnet, a third opening being formed at the third contact frame, a laser for transferring a third color organic light emission layer passing through the third opening; and irradiating the laser to the third donor film through the third opening of the third contact frame to transfer the third color organic light emission layer to a third sub-pixel region.

According to another aspect of a second embodiment of the present invention, laser induced thermal imaging apparatus includes: a substrate stage including a magnet or magnetic substance, the acceptor substrate and a donor film being sequentially fed and laminated on the substrate stage, the acceptor substrate having a pixel definition region in which first, second, and third sub-pixels are formed in a mosaic pattern, the donor film having an organic light emission layer to be transferred on the pixel definition region; a laser oscillator for irradiating a laser to the donor film; a contact frame adapted to be disposed between the substrate stage and the laser oscillator for forming a magnetic force with the substrate stage, and including an opening through which the laser passes; and a contact frame feed mechanism for moving the contact frame in a direction of the substrate stage.

According to another aspect of a second embodiment of the present invention, there is provided a method for fabricating an organic light emitting diode having an emission layer formed between electrodes by the laser induced thermal imaging apparatus, the method including: placing an acceptor substrate having a pixel definition region in which first, second, and third sub-pixels are formed in a mosaic pattern, on a substrate stage having a magnet; placing a donor film having an organic light emission layer to be transferred on the pixel definition region, on the acceptor substrate; adhering a first contact frame to a first donor film using magnetic attraction, the first contact frame having a magnet, a first opening being formed at the first contact frame, a laser for transferring a first color organic light emission layer passing through the opening; irradiating the laser to the first donor film through the first opening of the first contact frame to transfer the first color organic light emission layer to a first sub-pixel region; separating the first contact frame from the first donor film; placing a second donor film having a second color organic light emission layer on the acceptor substrate in place of the first donor film; adhering a second contact frame to a second donor film using magnetic attraction, the second contact frame having a magnet, a second opening being formed at the second contact frame, a laser for transferring a second color organic light emission layer passing through the second opening; irradiating the laser to the second donor film through the second opening of the second contact frame to transfer the second color organic light emission layer to a second sub-pixel region; separating the second contact frame from the second donor film; placing a third donor film having a third color organic light emission layer on the acceptor substrate in place of the second donor film; adhering a third contact frame to a third donor film using magnetic attraction, the third contact frame having a magnet, a third opening being formed at the third contact frame, a laser for transferring a third color organic light emission layer passing through the third opening; and irradiating the laser to the third donor film through the third opening of the third contact frame to transfer the third color organic light emission layer to a third sub-pixel region.

According to an aspect of a third embodiment of the present invention, there is provided a laser induced thermal imaging apparatus including: a substrate stage including a magnet or a magnetic substance, the acceptor substrate and a donor film being sequentially fed and laminated on the substrate stage, the acceptor substrate having a pixel definition region in which first, second, and third sub-pixels are formed in a delta pattern, the donor film having an organic light emission layer to be transferred on the pixel definition region; a laser oscillator for irradiating a laser to the donor films; a contact frame adapted to be disposed between the substrate stage and the laser oscillator for forming a magnetic force with the substrate stage, and including an opening through which the laser passes; and a contact frame feed mechanism for moving the contact frame in a direction of the substrate stage.

According to another aspect of a third embodiment of the present invention, there is provided a method for fabricating an organic light emitting diode having an emission layer formed between electrodes by the laser induced thermal imaging apparatus, the method including: placing an acceptor substrate having a pixel definition region in which first, second, and third sub-pixels are formed in a delta pattern, on a substrate stage having a magnet; placing a donor film having an organic light emission layer to be transferred on the pixel definition region, on the acceptor substrate; adhering a first contact frame to a first donor film using magnetic attraction, the first contact frame having a magnet, a first opening being formed at the first contact frame, a laser for transferring a first color organic light emission layer passing through the opening; irradiating the laser to the first donor film through the first opening of the first contact frame to transfer the first color organic light emission layer to a first sub-pixel region; separating the first contact frame from the first donor film; placing a second donor film having a second color organic light emission layer on the acceptor substrate in place of the first donor film; adhering a second contact frame to a second donor film using magnetic attraction, the second contact frame having a magnet, a second opening being formed at the second contact frame, a laser for transferring a second color organic light emission layer passing through the second opening; irradiating the laser to the second donor film through the second opening of the second contact frame to transfer the second color organic light emission layer to a second sub-pixel region; separating the second contact frame from the second donor film; placing a third donor film having a third color organic light emission layer on the acceptor substrate in place of the second donor film; adhering a third contact frame to a third donor film using magnetic attraction, the third contact frame having a magnet, a third opening being formed at the third contact frame, a laser for transferring a third color organic light emission layer passing through the third opening; and irradiating the laser to the third donor film through the third opening of the third contact frame to transfer the third color organic light emission layer to a third sub-pixel region.

According to an aspect of a fourth embodiment of the present invention, there is provided a laser induced thermal imaging apparatus for forming an emission layer of an organic light emitting diode in which one pixel includes at least three sub-pixels having first to third emission layers, at least one of the first to third emission layers is formed at an entire surface of a pixel portion in common, the apparatus including: a chamber including a substrate stage and a contact frame, the substrate stage having a magnet or a magnet material, and the contact frame being adapted to be disposed between the substrate stage and a laser oscillator, and a laser induced thermal imaging is performed in the chamber; the laser oscillator for irradiating a laser to the contact frame and a donor film; and a contact frame feed mechanism for moving the contact frame in a direction of the substrate stage, wherein the contact frame includes an opening, the first and second sub-pixels being formed corresponding to the opening, and the substrate stage forming a magnetic force with the contact frame.

According to another aspect of a fourth embodiment of the present invention, there is provided a method for fabricating an organic light emitting diode having an emission layer formed between first and second electrodes by the laser induced thermal imaging apparatus, the method including: placing an acceptor substrate having first, second, and third sub-pixel regions constituting one pixel on a substrate stage having a magnet or magnetic substance; placing a donor film having an organic light emission layer to be transferred on the pixel definition region, on the acceptor substrate; adhering a contact frame having a magnet or magnetic substance to a first donor film using magnetic attraction, an opening being formed at the contact frame, a laser for transferring first and second color organic light emission layers passing through the opening; irradiating the laser from a laser oscillator to the first donor film through the opening of the contact frame to transfer the first color organic light emission layer to the first sub-pixel region; separating the contact frame from the first donor film; placing a second donor film having a second color organic light emission layer on the acceptor substrate in place of the first donor film; again adhering the contact frame to a second donor film using magnetic attraction; and irradiating the laser from a laser oscillator to the second donor film through the opening of the contact frame to transfer the second color organic light emission layer to the second sub-pixel region, wherein an emission of the third sub-pixel is deposited and formed at a pixel portion region in which the pixels are formed.

According to an aspect of a fifth embodiment of the present invention, there is provided a laser induced thermal imaging apparatus including: a substrate stage including a magnet, the acceptor substrate and a donor film being sequentially fed and laminated on the substrate stage, the acceptor substrate having a pixel definition region in which first and second sub-pixels, and two third sub-pixels constituting one pixel, the donor film having an organic light emission layer to be transferred on the pixel definition region; a laser oscillator for irradiating a laser to the donor film; a contact frame adapted to be disposed between the substrate stage and the laser oscillator, including magnetic substance for forming a magnetic force with the substrate stage, and including an opening through which the laser passes; and a contact frame feed mechanism for moving the contact frame in a direction of the substrate stage, wherein the contact frame includes first and second frames; first and second openings are formed at the first and second frames; the first and second sub-pixels are formed at the first opening, and two third sub-pixels are formed at the second opening, the first and second frames are alternately mounted to form an emission layer of an organic light emitting diode.

According to another aspect of a fifth embodiment of the present invention, there is provided a method for fabricating an organic light emitting diode having an emission layer formed between first and second electrodes by the laser induced thermal imaging apparatus, the method including: placing an acceptor substrate having first and second pixels regions, and two third sub-pixel regions constituting one pixel on a substrate stage having a magnet; placing a donor film having an organic light emission layer to be transferred on the pixel definition region, on the acceptor substrate; adhering a first contact frame having a magnet to a first donor film using magnetic attraction, an opening being formed at the contact frame, a laser for transferring first and second color organic light emission layers passing through the opening; irradiating the laser to the first donor film through the opening of the first contact frame to transfer the first color organic light emission layer to the first sub-pixel region; separating the first contact frame from the first donor film; placing a second donor film having a second color organic light emission layer on the acceptor substrate in place of the first donor film; again adhering the first contact frame to a second donor film using magnetic attraction; irradiating the laser to the second donor film through the opening of the first contact frame to transfer the second color organic light emission layer to the second sub-pixel region; separating the first contact frame from the second donor film, and substituting the first contact frame by a second contact frame, the second contact frame including a magnet, and an opening is formed at the second contact frame, and a laser for transferring a third color organic light emission layer of the third donor film passing through the opening; placing a third donor film having the third color organic light emission layer on the acceptor substrate in place of the second donor film; adhering the second contact frame to the third donor film using magnetic attraction; and irradiating the laser on the third donor film through the opening of the second contact frame to transfer the third color organic light emission layer to two third pixel regions.

According to an aspect of a sixth embodiment of the present invention, there is provided a laser induced thermal imaging apparatus for forming an emission layer of an organic light emitting diode including: a chamber including a substrate stage and being adapted to receive a contact frame, the substrate stage having a magnet or a magnet material, and the contact frame being adapted to be disposed between the substrate stage and a laser oscillator, and a laser induced thermal imaging is performed in the chamber; the laser oscillator for irradiating a laser to the contact frame and a donor film; and a contact frame feed mechanism for moving the contact frame in a direction of the substrate stage, the contact frame includes a magnet or magnetic substance, first, second, and third contact frames; a first sub-pixel, a second sub-pixel, and third two sub-pixels constituting one pixel, the first opening corresponding to a first sub-pixel region being formed at the first contact frame, the second opening corresponding to a second sub-pixel region being formed at the second contact frame, the third opening corresponding to two third sub-pixel regions being formed at the third contact frame; and the first, second, and third contact frames are alternately mounted to form an emission layer of an organic light emitting diode.

According to another aspect of a sixth embodiment of the present invention, there is provided a method for fabricating an organic light emitting diode having an emission layer formed between first and second electrodes by the laser induced thermal imaging apparatus, the method including: placing an acceptor substrate having first and second pixels regions, and two third sub-pixel regions constituting one pixel on a substrate stage having a magnet or magnetic substance; placing a donor film having an organic light emission layer to be transferred on the pixel definition region, on the acceptor substrate; adhering a first contact frame having a magnet or magnetic substance to a first donor film using magnetic attraction, an opening being formed at the contact frame, a laser for transferring a first color organic light emission layer passing through the opening; irradiating the laser from a laser oscillator to the first donor film through the opening of the first contact frame to transfer the first color organic light emission layer to the first sub-pixel region; separating the first contact frame from the first donor film, and substituting the first contact frame by a second contact frame, the second contact frame including a magnet or magnetic substance, and an opening is formed at the second contact frame, and a laser for transferring a second color organic light emission layer of the second donor film passing through the opening; placing a second donor film having the second color organic light emission layer on the acceptor substrate in place of the first donor film; adhering the second contact frame to a second donor film using magnetic attraction; irradiating the laser from a laser oscillator to the second donor film through the opening of the second contact frame to transfer the second color organic light emission layer to the second sub-pixel region; separating the second contact frame from the second donor film, and substituting the first contact frame by a second contact frame, the second contact frame including a magnet or magnetic substance, and an opening is formed at the third contact frame, and a laser for transferring a third color organic light emission layer of the third donor film passing through the opening; placing a third donor film having the third color organic light emission layer on the acceptor substrate in place of the second donor film; adhering the third contact frame to a third donor film using magnetic attraction; and irradiating the laser from a laser oscillator to the third donor film through the opening of the third contact frame to transfer the third color organic light emission layer to the third sub-pixel region.

BRIEF DESCRIPTION OF THE DRAWINGS

These and/or other aspects and features of the invention will become apparent and more readily appreciated from the following description of the exemplary embodiments, taken in conjunction with the accompanying drawings of which:

FIG. 10 is a flow diagram that illustrates a fabricating method of organic light emitting diodes according to the third embodiment of the present invention;

DETAILED DESCRIPTION

Embodiment 1

Figure 1:
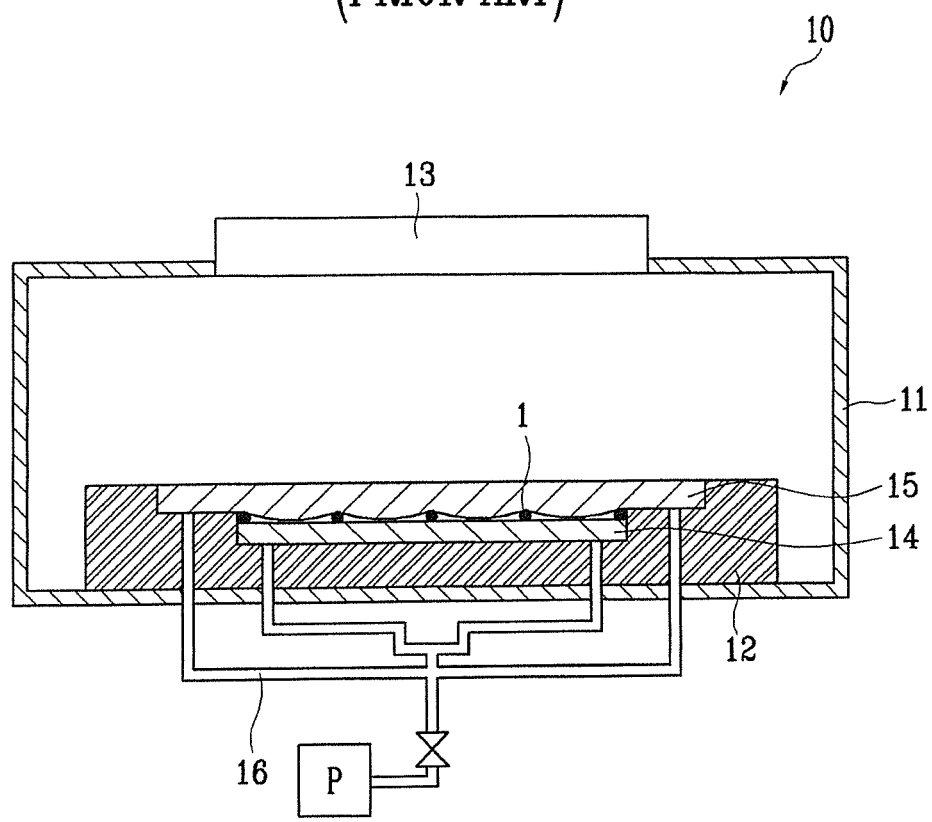
FIG. 1 is a cross-sectional view showing a conventional laser induced thermal imaging apparatus.
Figure 2:
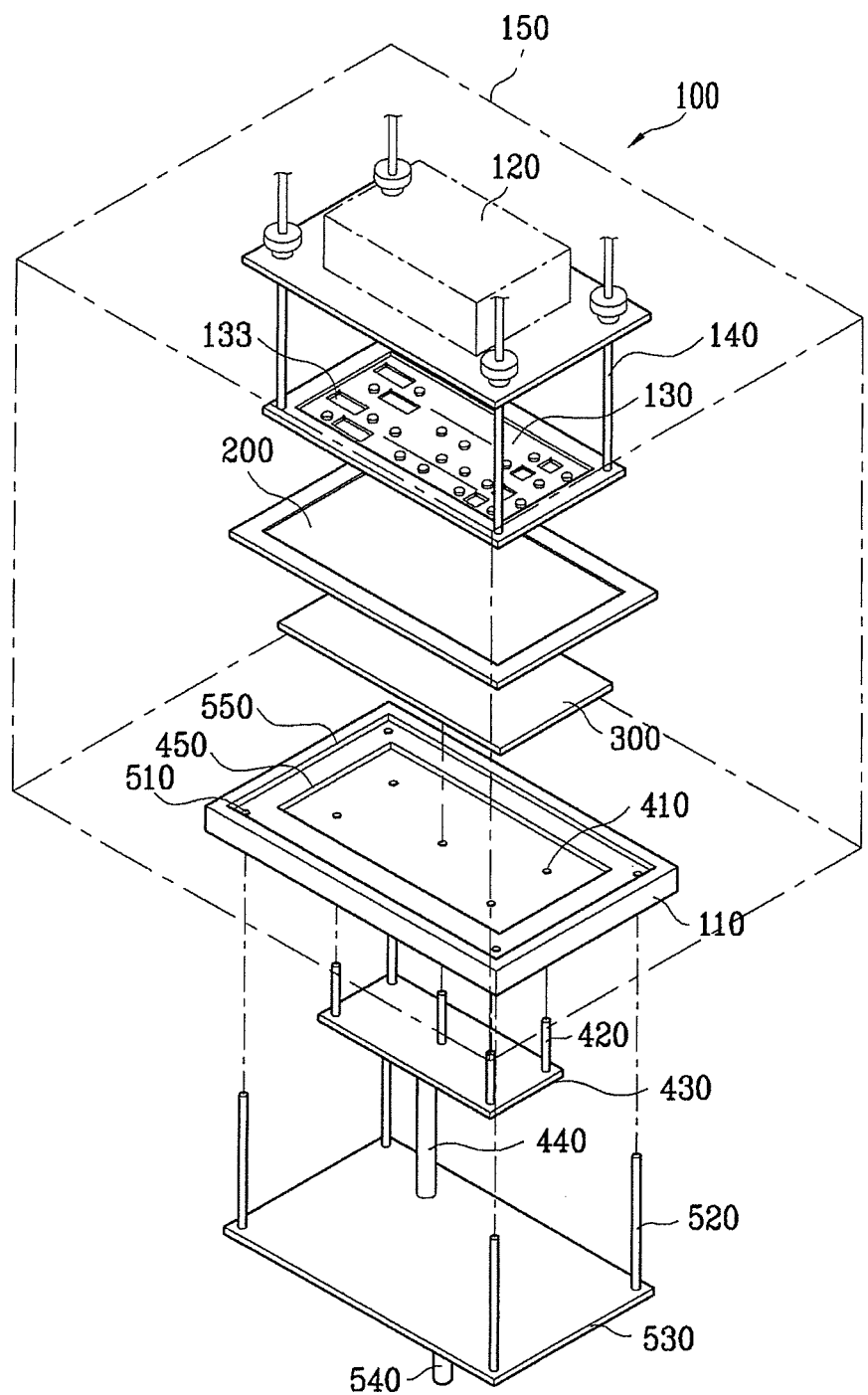
FIG. 2 is an exploded perspective view showing an embodiment of a laser induced thermal imaging apparatus according to the present invention.

Hereinafter, exemplary embodiments according to the present invention will be described with reference to the accompanying drawings. Here, when one element is described as being connected to another element, that element may be directly connected to another element or indirectly connected to another element via a third element. Further, some of the parts that are not essential to the complete understanding of the invention have been omitted for clarity. Also, like reference numerals refer to like elements throughout. FIG. 2 is a perspective view showing an embodiment of a laser induced thermal imaging apparatus according to the present invention. Referring to FIG. 2, the laser induced thermal imaging apparatus 100 includes a substrate stage 110, a laser oscillator 120, a contact frame 130, a contact frame feed mechanism 140, and a chamber 150.

First, a chamber for the laser induced thermal imaging apparatus 100 may be used as the chamber 150. The substrate stage 110 and the contact frame 130 are mounted inside the chamber 150. A donor film 200 and an acceptor substrate 300 are fed into the chamber 150. For this, a feed mechanism (not shown) for feeding the donor film 200 and the acceptor substrate 300 into the chamber 150 is disposed outside the chamber 150.

The acceptor substrate 300 according to an embodiment of the present invention has a pixel definition region (or pixel region) in which first, second, and third sub-pixels are formed in a stripe pattern, the donor film 200 includes a transfer layer (or imaging layer) for transferring an organic light emitting layer to the pixel defining region of the acceptor substrate 300.

The substrate stage 110 is disposed at or near a lower surface of the chamber 150. In the described embodiment of the present invention, the substrate stage 110 is provided with at least one electromagnet (not shown in FIG. 2). However, it would be appreciated by those skilled in the art that a permanent magnet or magnetic substance may be used instead of or in addition to the electromagnet without departing from the principles and spirit of the invention.

Figure 3A:
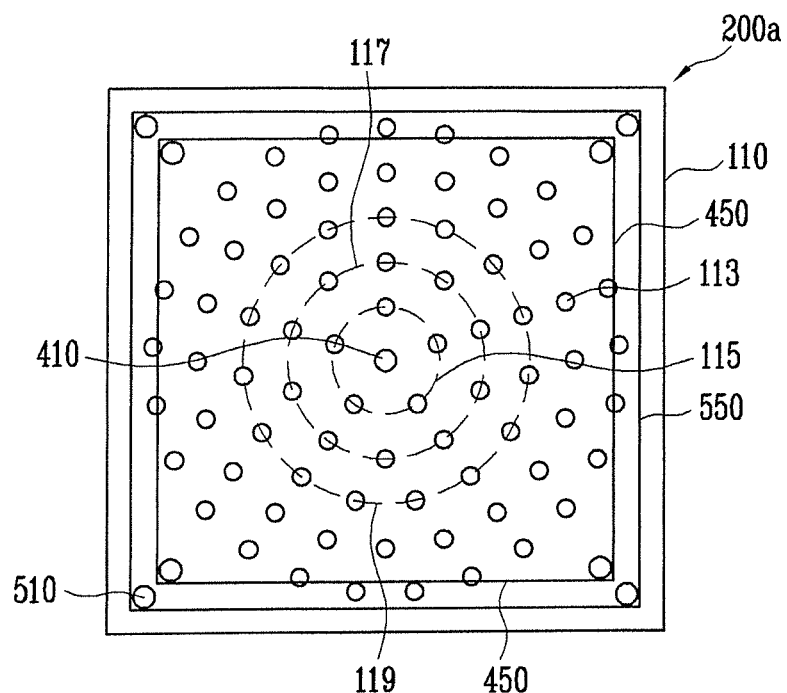
FIG. 3A and FIG. 3B are plan views respectively showing examples of a substrate stage of the laser induced thermal imaging apparatus according to the present invention.
Figure 3B:
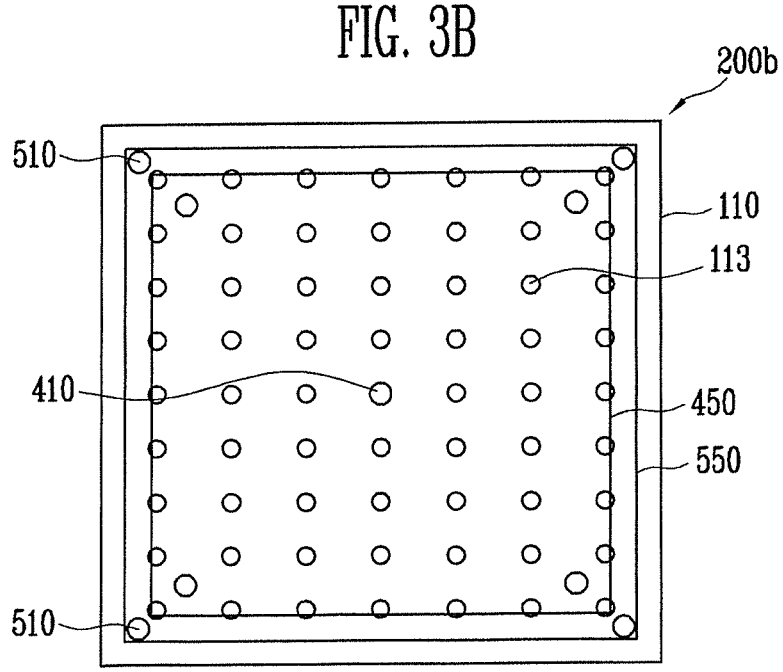

The electromagnet included in the substrate stage 110 will be described with reference to FIGS. 3A and 3B. FIGS. 3A and 3B are plan views respectively showing that electromagnets 113 are concentrically formed or formed in a plurality of lines in the substrate stage 110. As shown in FIG. 3A, when the electromagnets 113 of the substrate stage 110 are concentrically disposed, power is first applied to first electromagnets 113 that define an innermost concentric circle 115. In this state, a power is applied to second electromagnets 113 that define a second inner concentric circle 117 encircling the innermost concentric circle 115. Next, a power is applied to third electromagnets 113 that define a concentric circle 119 outside the second inner concentric circle, with the result that a magnetic attraction with a magnet of a contact frame to be described later is generated to achieve the laminating while minimizing or reducing the occurrence of impurities or space between a donor film 200a and the acceptor substrate 300.

Further, in the described embodiment, as shown in FIG. 3B, when the electromagnets 113 of a substrate stage 110 are formed in a plurality of transverse and longitudinal lines, a power is applied to only the electromagnet 113 on which a laser is irradiated or only the electromagnets 113 of a corresponding line, thereby generating a magnetic attraction with a magnet of a contact frame to be described later. Accordingly, a local laminating continues to be achieved between a donor film 200b and the acceptor substrate 300 at only parts on which a laser is irradiated, with the result that the laminating is completed while minimizing or reducing the occurrence of space or impurities. An electric wiring for applying a power may be installed at each electromagnet.

The substrate stage 110 further includes a drive mechanism (not shown) for feeding the substrate stage 110. When the substrate stage 110 is fed, the laser oscillator 120 can be configured to irradiate a laser in one direction. For example, when a laser is irradiated in a longitudinal direction and the substrate stage 110 further includes a drive mechanism for feeding the substrate stage 110, a laser can be irradiated to an entire surface of the donor film 200.

Furthermore, the substrate stage 110 can further include a mounting mechanism for receiving and mounting the acceptor substrate 300 and the donor film 200. The mounting mechanism is used to mount the acceptor substrate 300, and the donor film 200 is fed in the chamber 150 by a feed mechanism at a determined position of the substrate stage 110.

In the embodiment, the mounting mechanism may include through holes 410 and 510, guide bars 420 and 520, moving plates 430 and 530, support members 440 and 540, and mounting grooves 450 and 550. The guide bars 420 ascend or descend with the moving plate 430 and the support member 440. The guide bars 420 ascend through the through holes 410 to receive the acceptor substrate 300. The guide bars 420 descend to mount the acceptor substrate 300 in a first mounting groove 450 formed on the substrate stage 110. Those skilled in the art would know how to implement the mounting mechanism based on the disclosure herein. Further, the mounting mechanism can be changed by those skilled in the art, and is not limited thereto.

Figure 4:
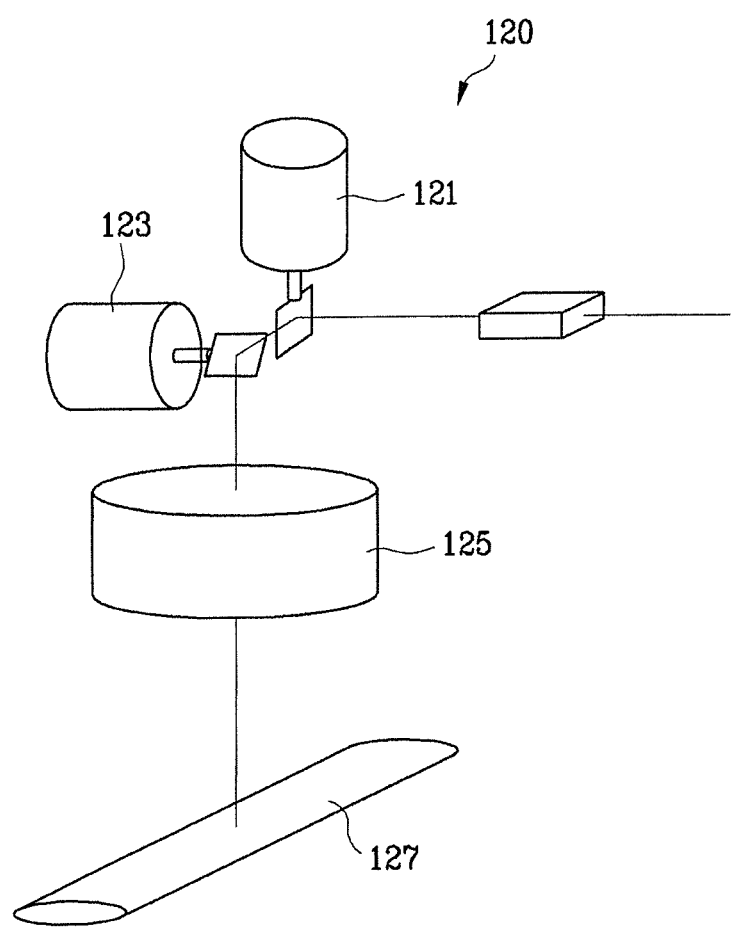
FIG. 4 is a view showing an example of a laser oscillator of the laser induced thermal imaging apparatus according the present invention.

The laser oscillator 120 may be installed outside or inside a chamber 150. The laser oscillator 120 may be installed such that a laser is provided at an upper part. Referring to FIG. 4 showing a schematic view of the laser oscillator 120, CW DN:YAG laser (1604 nm) may be used as the laser oscillator of the embodiment. The laser oscillator includes two galvano meter scanners 121 and 123, a scan lens 125, and a cylinder lens 127. However, the present invention is not limited thereto.

The contact frame 130 includes one or more electromagnets, one or more permanent magnets, or magnetic substance. The contact frame 130 forms a magnetic force with a magnet of the substrate stage 110, so that the donor film 200 and the acceptor substrate 300 disposed between the substrate stage 110 and the contact frame 130 are strongly laminated. The contact frame 130 includes opening grooves (or openings) 133 through which a laser passes. Accordingly, the contact frame 130 also functions as a mask to irradiate the laser at only a predetermined position. In the described embodiment, the magnetic substance includes ferromagnetic substance and/or weak magnetic substance. In the described embodiment, the magnetic layer (or magnetic substance) is formed by one selected from the group consisting of Fe, Ni, Cr, $Fe_2O_3$, $Fe_3O_4$, $CoFe_2O_4$, magnetic nano particles, and a mixture thereof.

The contact frames include a first frame 130a_1, a second frame 130b_1, and a third frame 130c_1. First opening grooves 133a_1 are formed at the first frame 130a_1. First sub-pixels are formed corresponding to the first opening grooves 133a_1 according to an organic light emitting layer to be transferred. Magnets or magnetic substance 137a_1 are located at the first frame 130a_1. Second opening grooves 133b_1 are formed at the second frame 130b_1. Second sub-pixels are formed corresponding to second opening grooves 133b_1 according to an organic light emitting layer to be transferred. Magnets or magnetic substance 137b_1 are located at the second frame 130b_1. Third opening grooves 133c_1 are formed at the third frame 130c_1. Third sub-pixels are formed corresponding to the third opening grooves 133c_1 according to an organic light emitting layer to be transferred. Magnets or magnetic substance 137c_1 are located at the third frame 130c_1. The first, second, and third frames 130a_1, 130b_1, and 130c_1 are alternately mounted to form an emission layer of organic light emitting diodes.

Further, an opening groove may be formed at substantially an entire surface of the contact frame. Hence, it can be manufactured to use one contact frame. However, in this case, magnets may be installed at only edges of the contact frame, so that laminating due to a magnetic force between the donor film and the acceptor substrate does not actually occur as described herein. Accordingly, in one embodiment, an area of the magnet is equal to or greater than or equal to at least 50% of that of the contact frame.

Figure 5A:
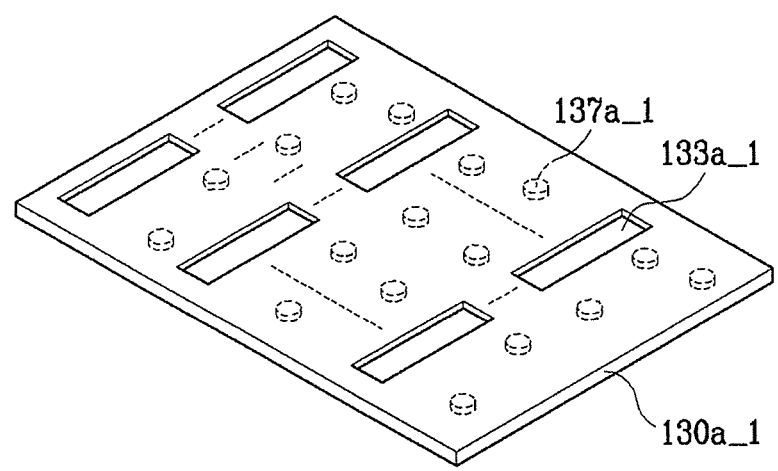
FIG. 5A, FIG. 5B, and FIG. 5C are perspective views respectively showing a first contact frame, a second contact frame, and a third contact frame according to a first embodiment of the present invention.
Figure 5B:
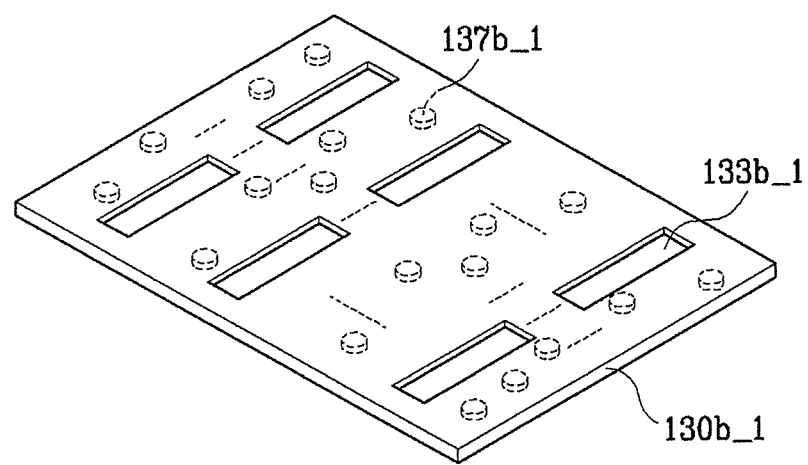
Figure 5C:
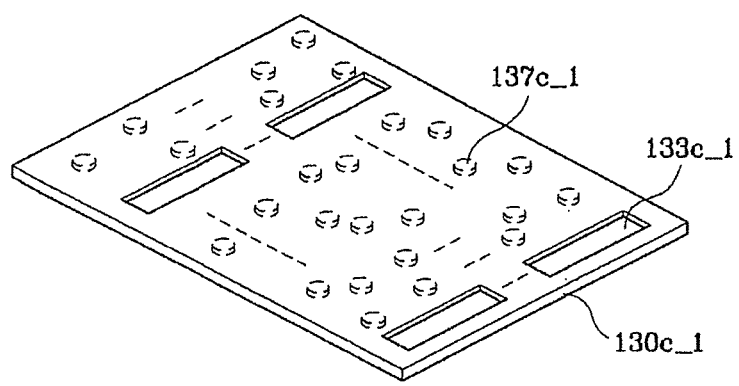
Figure 5D:
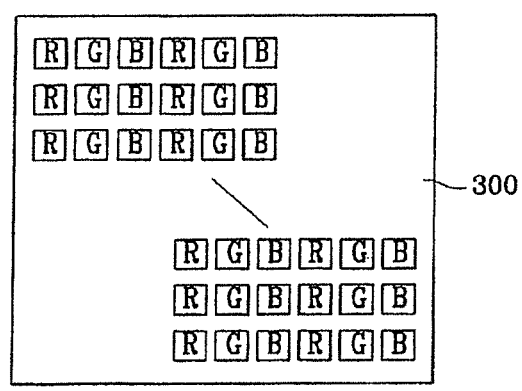
FIG. 5D is a plan view showing a pixel array of organic light emitting diodes formed by the first, second, and third contact frames shown in FIGS. 5A, 5B, and 5C.

FIGS. 5A, 5B and 5C show an embodiment of the first, second, and third contact frames, which are alternately mounted. FIG. 5D is a plan view showing a stripe pixel array of organic light emitting diodes formed by the first, second, and third contact frames shown in FIGS. 5A, 5B and 5C.

A plurality of first opening grooves 133a_1 corresponding to which the first sub-pixels are formed, are formed at the first contact frame 130a_1 of FIG. 5A. A plurality of second opening grooves 133b_1 corresponding to which the second sub-pixels are formed, are formed at the second contact frame 130b_1 of FIG. 5B. A plurality of third opening grooves 133c_1 corresponding to which the third sub-pixels are formed, are formed at the third contact frame 130c_1 of FIG. 5C.

Figure 6:
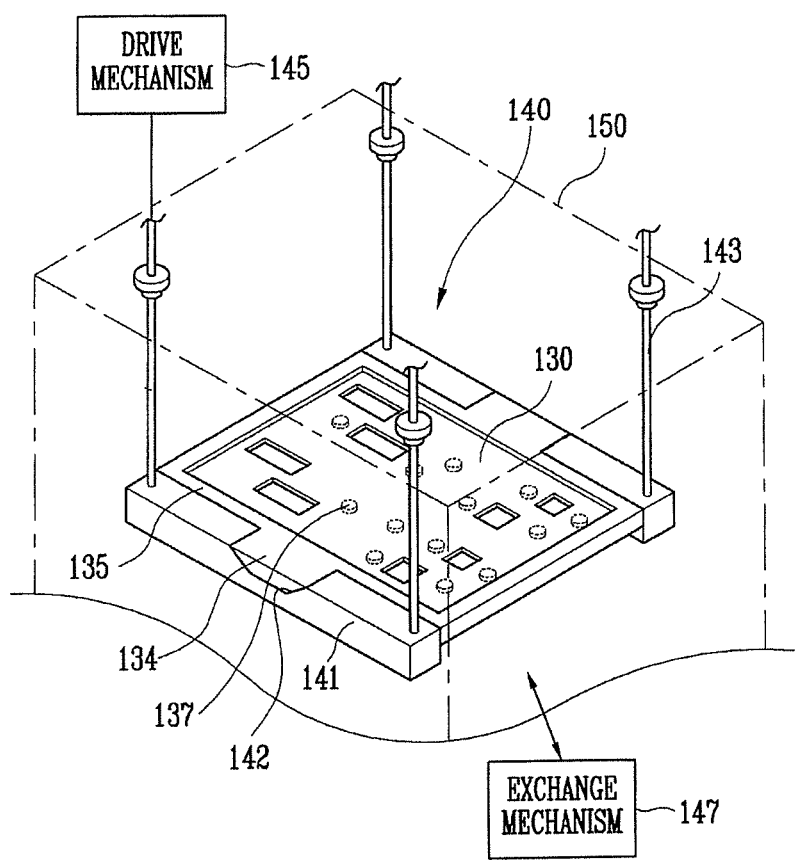
FIG. 6 is a perspective view showing a contact frame feed mechanism of a laser induced thermal imaging apparatus in one embodiment according to the present invention.
Figure 7:
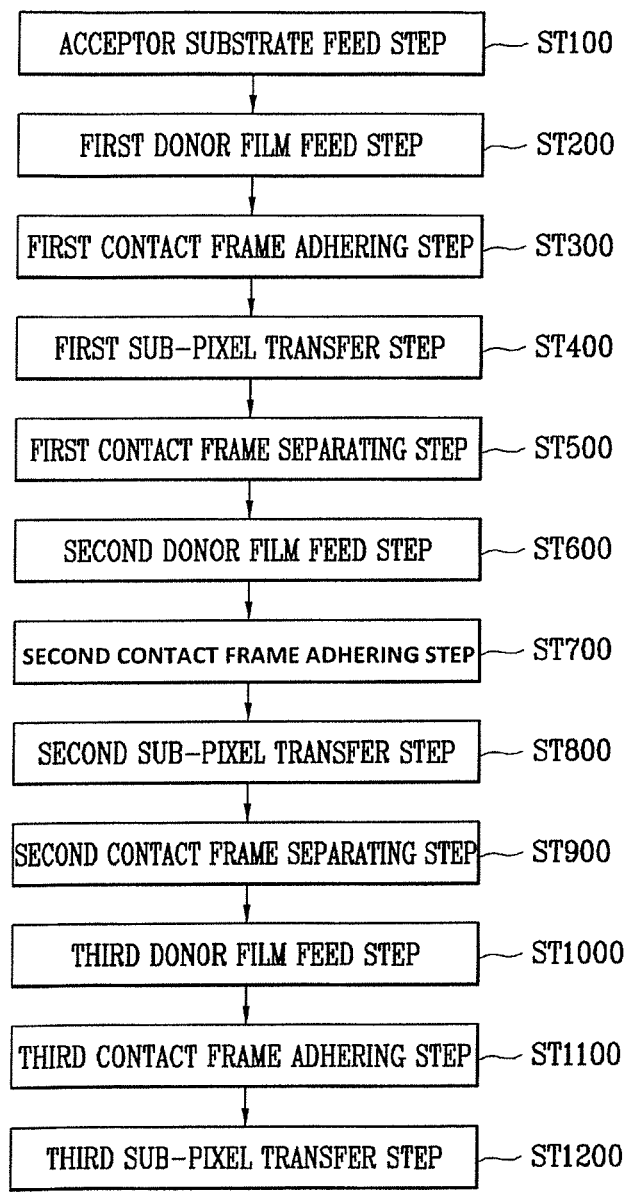
FIG. 7 is a flow diagram that illustrates a fabricating method of organic light emitting diodes according to a first embodiment of the present invention.

The contact frame feed mechanism 140 moves or reciprocates the contact frame 130 in a direction of the substrate stage, and can be manufactured using various different methods. As shown in FIG. 6, the contact frame feed mechanism 140 includes a holder 141, connecting bars 143, and a drive mechanism 145 (shown as a block diagram). The holder 141 includes a holding groove 142. The connecting bars 143 are connected to the holder 141 at an upper surface of the chamber 150. The drive mechanism drives the connecting bars 143 and the holder 141 up and down. Here, as shown, when the feed mechanism feeds the contact frame 130, the contact frame 130 is fed in a state that it is mounted on a tray 135 having a holding projection 134.

The first contact frame 130a_1 and the second contact frame 130b_1 are exchanged by an exchange mechanism 147 (shown as a block diagram) such as a robot arm. After the first sub-pixels are formed by using the first contact frame 130a_1 disposed on the holder, the robot arm removes the first contact frame 130a_1 from the holder to an outside, and positions the second contact frame 130b_1 at the holder, thereby achieving the exchange to form the second sub-pixels.

Next, a method for forming organic light emitting diodes by using the aforementioned laser induced thermal imaging apparatus will be explained with reference to FIGS. 2, 5A-5C, and 7. A method for fabricating organic light emitting diodes having an emission layer formed between electrodes by the laser induced thermal imaging apparatus includes an acceptor substrate feed step ST100, a first donor film feed step ST200, a first contact frame adhering step ST300, a first sub-pixel transfer step ST400, a first contact frame separating step ST500, a second donor film feed step ST600, a second contact frame adhering step ST700, a second sub-pixel transfer step ST800, a second contact frame separating step ST900, a third donor film feed step ST1000, a third contact frame adhering step ST1100, and a third sub-pixel transfer step ST1200.

The acceptor substrate feed step ST100 feeds the acceptor substrate 300 on which an organic light emission layer is formed on the substrate stage 110 having magnets or magnetic substance. A pixel region is defined at the acceptor substrate 300. An emission layer to be transferred is formed corresponding to the pixel region. A stripe type pixel is formed and arranged at the pixel region of the acceptor substrate 300.

The first donor film feed step ST200 feeds a first donor film having an emission layer to be transferred on the acceptor substrate 300. Here, the emission layer can be configured as one color, for example, red color.

The first contact frame adhering step ST300 adheres the first contact frame 130a_1 to a first donor film using magnetic attraction. The first contact frame 130a_1 includes magnets or magnetic substance. First opening grooves 133a_1 are formed at the first contact frame 130a_1, and a laser for transferring a first color organic light emission layer passes through the first opening grooves 133a_1. Here, a contact frame feed mechanism first feeds and adheres the first contact frame 130a_1 on the substrate stage 110, and further adheres it strongly using magnetic attraction.

The first sub-pixel transfer step ST400 expands and transfers a first color organic light emission layer included in the first donor film on a first sub-pixel region of the acceptor substrate 300 by irradiating a laser on the first donor film through the first opening grooves 133a_1 of the first contact frame 130a_1. At this time, an irradiation range of the laser can be adjusted so that the laser is irradiated to only the first sub-pixel region among regions corresponding to the opening grooves.

The first contact frame separating step ST500 separates the first contact frame 130a_1 from the first donor film by first separating the first contact frame 130a_1 by a magnetic repulsive force, and then by raising the contact frame to an upper portion of the chamber 150.

The second donor film feed step ST600 removes the first donor film from an upper portion of the acceptor substrate to an outside of the chamber, and feeds a second donor film having a second color organic light emission layer on the acceptor substrate 300. That is, the donor film feed mechanism substitutes the second donor film for the first donor film.

The second contact frame adhering step ST700 adheres the second contact frame 130b_1 to a second donor film using magnetic attraction. The second contact frame 130b_1 includes magnet or magnetic substance. Second opening groove 133b_1 are formed at the second contact frame 130b_1, and a laser for transferring a second color organic light emission layer passes through the second opening grooves 133b_1. Here, the contact frame feed mechanism first feeds and adheres the second contact frame 130b_1 on the substrate stage 110, and then adheres it strongly by a magnetic attraction.

The second sub-pixel transfer step ST800 expands and transfers a second color organic light emission layer included in the second donor film on a second sub-pixel region of the acceptor substrate 300 by irradiating a laser on the second donor film through the second opening grooves 133b_1 of the second contact frame 130b_1. At this time, an irradiation range of the laser can be adjusted so that the laser is irradiated to only the second sub-pixel region among regions corresponding to the opening grooves.

The third donor film feed step ST1000 removes the second donor film from an upper portion of the acceptor substrate to an outside of the chamber, and feeds a third donor film having a third color organic light emission layer on the acceptor substrate 300. That is, the donor film feed mechanism substitutes a third donor film for the second donor film.

The third contact frame adhering step ST1100 adheres the third contact frame 130c_1 to the third donor film using magnetic attraction. The third contact frame 130c_1 includes magnets or magnetic substance. Third opening grooves 133c_1 are formed at the third contact frame 130c_1, and a laser for transferring a third color organic light emission layer passes through the third opening grooves 133c_1. Here, the contact frame feed mechanism first feeds and adheres the third contact frame 130c_1 on the substrate stage 110, and then adheres it strongly using magnetic attraction.

The third sub-pixel transfer step ST1200 expands and transfers a third color organic light emission layer included in the third donor film on a third sub-pixel region of the acceptor substrate 300 by irradiating a laser on the third donor film through the third opening grooves 133c_1 of the third contact frame 130c_1. At this time, an irradiation range of the laser can be adjusted so that the laser is irradiated to only the third sub-pixel region among regions corresponding to the opening grooves.

In the described embodiment, a color of the first color organic light emission layer transferred in the first sub-pixel transfer step ST400 may be red, a color of the second color organic light emission layer transferred in the second sub-pixel transfer step ST800 may be green, and a color of the third color organic light emission layer transferred in the third sub-pixel transfer step ST1200 may be blue.

Alternatively, a color of the first color organic light emission layer transferred in the first sub-pixel transfer step ST400 may be green, a color of the second color organic light emission layer transferred in the second sub-pixel transfer step ST800 may be red, and a color of the third color organic light emission layer transferred in the third sub-pixel transfer step ST1200 may be blue.

In describing the fabricating process, respective contact frame exchange steps were not described. It would be appreciated by those skilled in the art that the contact frame exchange steps should be performed.

Embodiment 2

Hereinafter, like or the same elements are designated by like or the same numbers as are used in the first embodiment. Since an acceptor substrate and contact frames differ from those of the first embodiment, only the acceptor substrate and the contact frames will be described in detail.

Figure 8A:
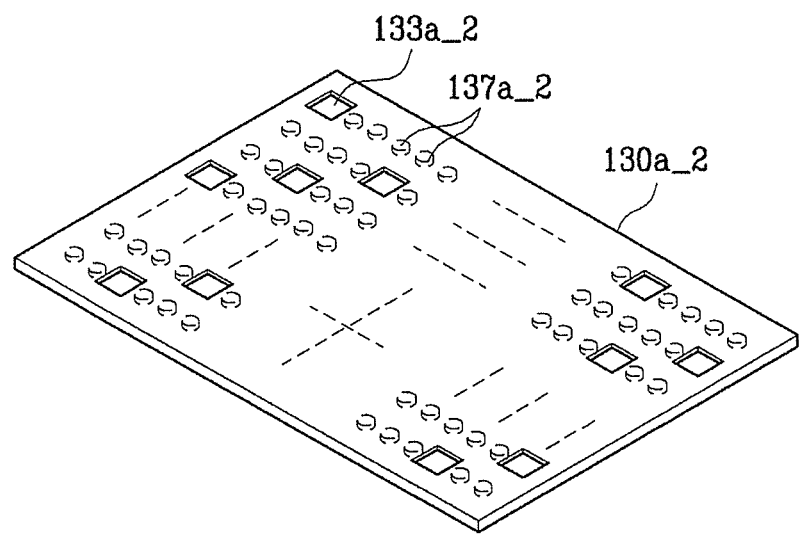
FIG. 8A, FIG. 8B, and FIG. 8C are plan views respectively showing a first contact frame, a second contact frame, and a third contact frame according to a second embodiment of the present invention.
Figure 8B:
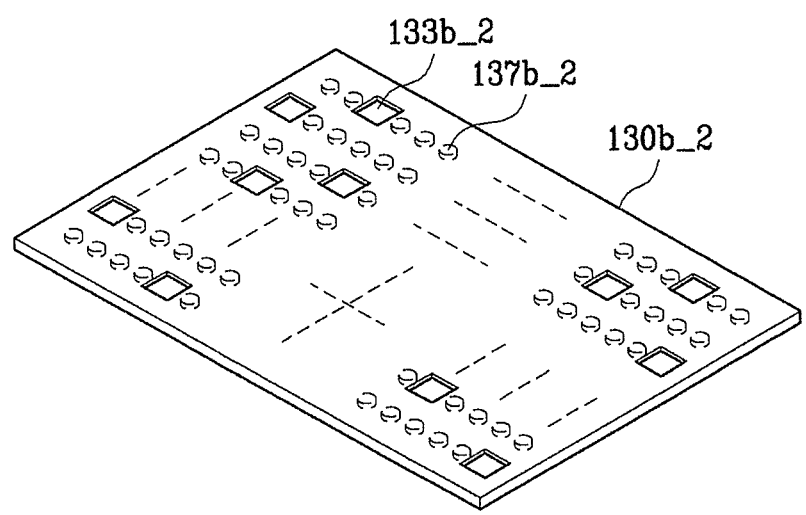
Figure 8C:
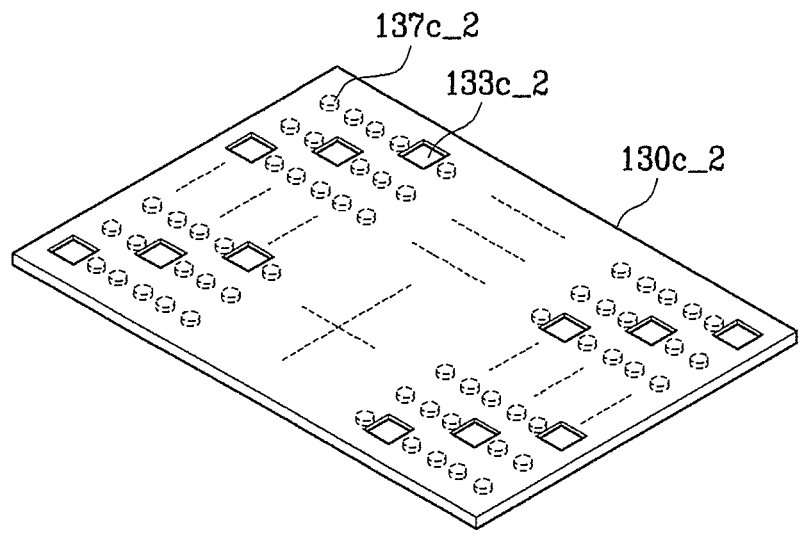
Figure 8D:
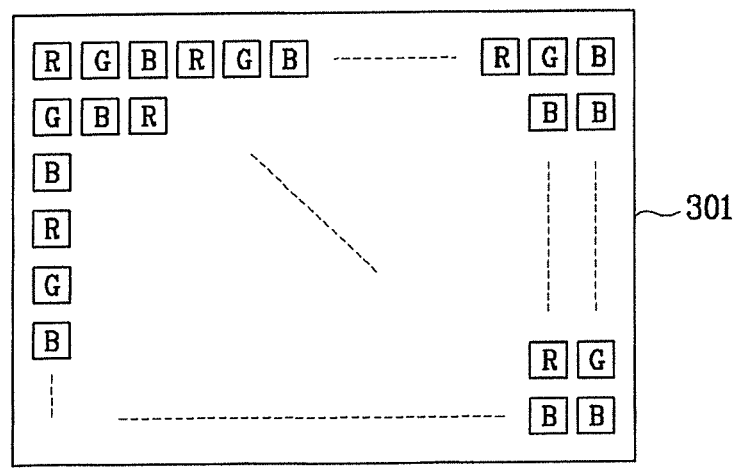
FIG. 8D is a plan view showing a pixel array of organic light emitting diodes formed by the first, second, and third contact frames shown in FIGS. 8A, 8B, and 8C.

As can be seen in FIG. 8D, an acceptor substrate 301 of a second embodiment includes a pixel definition region. First sub-pixels, Second sub-pixels, and Third sub-pixels are formed at the pixel definition region in a mosaic pattern. According to the mosaic pattern, sub-pixels of different colors are sequentially and continuously formed.

FIGS. 8A, 8B and 8C show an embodiment of the first, second, and third contact frames, which are alternately mounted. FIG. 8D is a plan view showing a mosaic pixel array of organic light emitting diodes formed by the first, second, and third contact frames shown in FIGS. 8A, 8B and 8C.

A plurality of first opening grooves 133a_2 corresponding to which the first sub-pixels are formed, are formed at the first contact frame 130a_2 of FIG. 8A. Magnets or magnetic substance 137a_2 are located at the first contact frame 130a_2. A plurality of second opening grooves 133b_2 corresponding to which the second sub-pixels are formed, are formed at the second contact frame 130b_2 of FIG. 8B. Magnets or magnetic substance 137b_2 are located at the second contact frame 130b_2. A plurality of third opening grooves 133c_2 corresponding to which the third sub-pixels are formed, are formed at the third contact frame 130c_2 of FIG. 8C. Magnets or magnetic substance 137c_2 are located at the third contact frame 130c_2. Because a fabricating method of the second embodiment is substantially identical to that of the first embodiment, a detailed description thereof is omitted.

Embodiment 3

Hereinafter, like or the same elements are designated by like or the same numbers as are used in the first embodiment. Since an acceptor substrate and contact frames differ from those of the first embodiment, only the acceptor substrate and the contact frames will be described in detail.

Figure 9A:
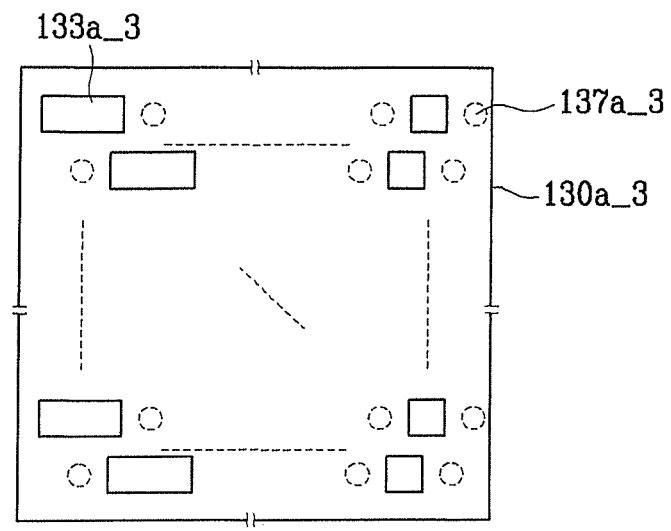
FIG. 9A and FIG. 9B are plan views respectively showing a first contact frame and a second contact frame according to a third embodiment of the present invention.
Figure 9B:
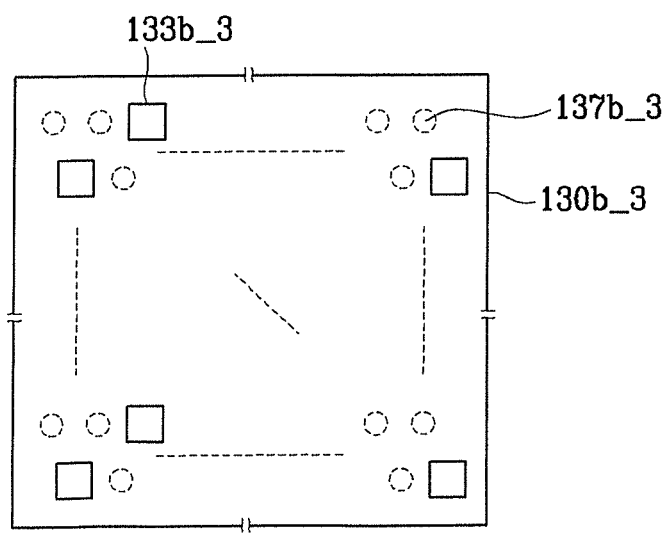
Figure 9C:
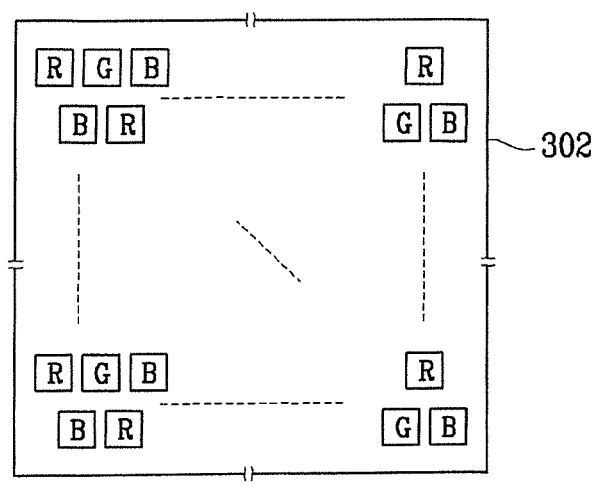
FIG. 9C is a plan view showing a pixel array of organic light emitting diodes formed by the first and second contact frames shown in FIGS. 9A and 9B.

FIGS. 9A and 9B show an embodiment of the first and second contact frames, which are alternately mounted. FIG. 9c is a plan view showing a delta pixel array of organic light emitting diodes formed on an acceptor substrate 302 by the first and second contact frames shown in FIGS. 9A and 9B. The third embodiment uses the acceptor substrate 302 to form a delta type pixel array. In the delta type pixel array, respective sub-pixels are arranged in a delta pattern.

A plurality of first opening grooves 133a_3 corresponding to which the first and second sub-pixels are formed, are formed at a first contact frame 130a_3. A plurality of second opening grooves 133b_3 corresponding to which the third sub-pixels are formed, are formed at a second contact frame 130b_3. Here, two contact frames 130a_3 and 130b_3 are alternately used.

A method for forming organic light emitting diodes according to the third embodiment of the present invention by the aforementioned laser induced thermal imaging apparatus will be described with reference to FIG. 2, FIGS. 9A-9C, and FIG. 10. A method for fabricating organic light emitting diodes having an emission layer formed between electrodes by the laser induced thermal imaging apparatus includes an acceptor substrate feed step ST2100, a first donor film feed step ST2200, a first contact frame adhering step ST2300, a first sub-pixel transfer step ST2400, a first contact frame separating step ST2500, a second donor film feed step ST2600, a first contact frame re-adhering step ST2700, a second sub-pixel transfer step ST2800, a second contact frame exchange step ST2900, a third donor film feed step ST3000, a second contact frame adhering step ST3100, and a third sub-pixel transfer step ST3200.

The acceptor substrate feed step ST2100 feeds the acceptor substrate 302 on which an organic light emission layer is formed on the substrate stage 110 having magnets or magnetic substance. A pixel region is defined at the acceptor substrate 302. An emission layer to be transferred is formed corresponding to the pixel region. A stripe type pixel is formed and arranged at the pixel region of the acceptor substrate 302.

The first donor film feed step ST2200 feeds a first donor film having an emission layer to be transferred on the acceptor substrate 302. Here, the emission layer can be configured as one color, for example, red color.

The first contact frame adhering step ST2300 adheres the first contact frame 130a_3 to a first donor film using magnetic attraction. The first contact frame 130a3 includes magnets or magnetic substance 137a_3. First opening grooves 133a_3 are formed at the first contact frame 130a_3, and a laser for transferring a first color organic light emission layer passes through the first opening grooves 133a_3. Here, a contact frame feed mechanism first feeds and adheres the first contact frame 130a_3 on the substrate stage 110, and then adheres it strongly using magnetic attraction.

The first sub-pixel transfer step ST2400 expands and transfers a first color organic light emission layer included in the first donor film on a first sub-pixel region of the acceptor substrate 302 by irradiating a laser on the first donor film through first opening grooves 133a_3 of the first contact frame 130a_3. Here, an irradiation range of the laser can be adjusted so that the laser is irradiated to only the first sub-pixel region among regions corresponding to the opening grooves.

The first contact frame separating step ST2500 separates the first contact frame 130a_3 from the first donor film by first separating the first contact frame 130a_3 by a magnetic repulsive force, and then by raising the contact frame to an upper portion of the chamber 150 by a contact frame feed mechanism.

The second donor film feed step ST2600 removes the first donor film from an upper portion of the acceptor substrate to an outside of the chamber, and feeds a second donor film having a second color organic light emission layer on the acceptor substrate 302. That is, the donor film feed mechanism substitutes the second donor film for the first donor film.

The first contact frame re-adhering step ST2700 again adheres the first contact frame 130*a*_3 from the donor film in step ST2500 to a second donor film using magnetic attraction. Here, the contact frame feed mechanism first feeds and adheres the first contact frame 130*a*_3 on the substrate stage 110, and then adheres it strongly using magnetic attraction.

The second sub-pixel transfer step ST2800 expands and transfers a second color organic light emission layer included in the second donor film on a second sub-pixel region of the acceptor substrate 302 by irradiating a laser on the second donor film through opening grooves of the first contact frame. At this time, an irradiation range of the laser can be adjusted so that the laser is irradiated to only the second sub-pixel region among regions corresponding to the opening grooves.

The second contact frame exchange step ST2900 eliminates a magnetic force or generates a magnetic repulsive force between the first contact frame 130*a*_3 and the substrate stage 110 to separate the first contact frame 130*a*_3 from the second donor film, and then substitutes the second contact frame 130*b*_3 for the first contact frame 130*a*_3. The second contact frame 130*b*_3 has magnets or magnetic substance 137*b*_3. Opening grooves 133*b*_3 are formed at the second contact frame 130*b*_3 and a laser for transferring a third color organic light emission layer of the third donor film passes through the opening grooves 133*b*_3.

The third donor film feed step ST3000 removes the second donor film from an upper portion of the acceptor substrate to an outside of the chamber, and feeds a third donor film having a third color organic light emission layer on the acceptor substrate 302. That is, the donor film feed mechanism substitutes the third donor film for the second donor film.

The second contact frame adhering step ST3100 adheres the second contact frame 130*b*_3 to a third donor film using magnetic attraction. The second contact frame 130*b*_3 includes the magnets or magnetic substance 137*b*_3. Second opening grooves 133*b*_3 are formed at the second contact frame 130*b*_3, and a laser for transferring a third color organic light emission layer passes through the second opening grooves 133*b*_3. Here, the contact frame feed mechanism first feeds and adheres the second contact frame 130*b*_3 on the substrate stage 110, and then adheres it strongly using magnetic attraction.

The third sub-pixel transfer step ST3200 expands and transfers a third color organic light emission layer included in the third donor film on a third sub-pixel region of the acceptor substrate 302 by irradiating a laser on the third donor film through the opening grooves 133*b*_3 of the second contact frame 130*b*_3. Here, an irradiation range of the laser can be adjusted so that the laser is irradiated to an entire region of the second contact frame 130*b*_3.

In the described embodiment, a color of the first color organic light emission layer transferred in the first sub-pixel transfer step ST2400 may be red, a color of the second color organic light emission layer transferred in the second sub-pixel transfer step ST2800 may be green, and a color of the third color organic light emission layer transferred in the third sub-pixel transfer step ST3200 may be blue.

Alternatively, a color of the first color organic light emission layer transferred in the first sub-pixel transfer step ST2400 may be green, a color of the second color organic light emission layer transferred in the second sub-pixel transfer step ST2800 may be red, and a color of the third color organic light emission layer transferred in the third sub-pixel transfer step ST3200 may be blue.

Embodiment 4

Hereinafter, like or the same elements in the fourth embodiment are designated by like or the same numbers as are used in the first embodiment. Since an acceptor substrate and contact frames differ from those of the first embodiment, only the acceptor substrate and the contact frames will be described in detail.

Figure 11A:
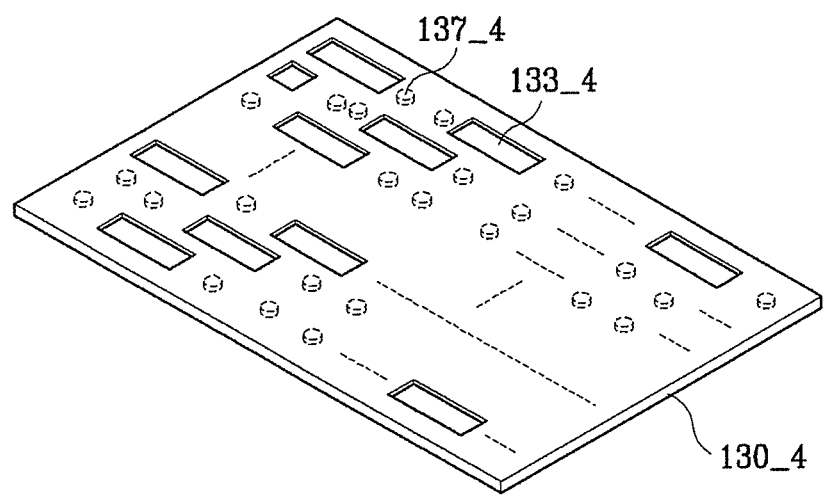
FIG. 11A is a plan view showing a contact frame according to a fourth embodiment of the present invention.
Figure 11B:
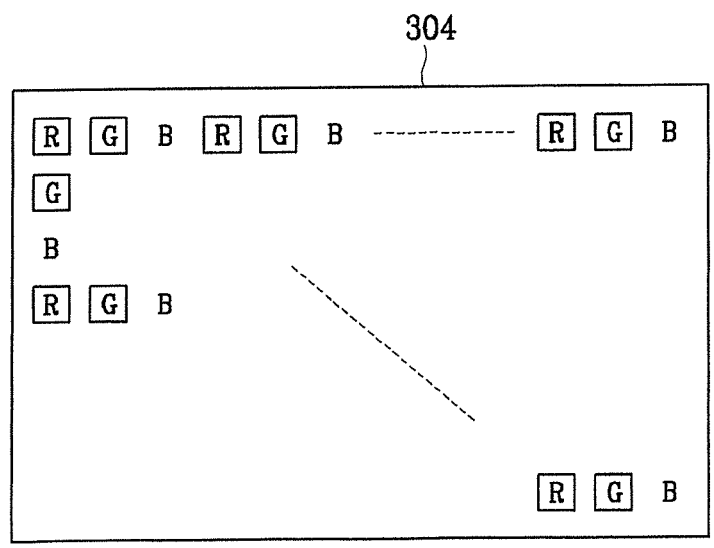
FIG. 11B is a plan view showing a pixel array of organic light emitting diodes formed by the contact frame shown in FIG. 11A.

FIG. 11A shows an embodiment of a contact frame 130_4. FIG. 11B is a plan view showing a pixel array of organic light emitting diodes formed by the contact frame 130_4 shown in FIG. 11A. In order to form a magnetic force with magnets or magnetic substance of the substrate stage to strongly laminate the acceptor substrate 304 and a donor film positioned between the substrate stage 110 and the contact frame 130_4, the contact frame 130_4 includes magnets, which may be electromagnets or permanent magnets, or the contact frame itself may be formed using magnetic substance in the described embodiment. At least one of the substrate stage 110 or the contact frame 130_4 should include magnets.

Furthermore, the contact frame 130_4 includes opening grooves 133_4 through which a laser passes. The contact frame 130_4 is used for lamination, and can concurrently function as a mask to cause the laser to be irradiated to predetermined positions. The opening grooves 133_4 can be variously set according to a pixel array having an organic light emission layer to be transferred. For example, when only the first and second sub-pixels among the first to third sub-pixels in one pixel is formed by a laser induced thermal imaging method, and a common layer is deposited all over a pixel portion to form a third sub-pixel, opening grooves 133_4 can be formed at formation positions of the first and second sub-pixels, which are arranged adjacent to each other in the same row. In the described embodiment, the first, second, and third sub-pixels are red, green, and blue, respectively. However, the present invention is not limited thereto.

Here, the opening grooves 133_4 for forming the first and second sub-pixels are formed in common. Accordingly, the first and second sub-pixels are formed using the same contact frame 130_4 to transfer an emission layer of the first and second sub-pixels at an exact position by controlling a laser beam. This causes the number of contact frames to be reduced and a process to be simplified. After the emission layer of the first and second sub-pixels is formed, the acceptor substrate 304 is fed into a deposition chamber (not shown in FIG. 11A) and third sub-pixels are formed by a thermal deposition. At this time, since a special mask process is unnecessary, a process is further simplified.

Referring to FIG. 11B showing a pixel portion in which a pixel is formed using the aforementioned contact frame 130_4, one pixel includes first to third sub-pixels. A region other than formation regions of the first and second sub-pixels becomes a third sub-pixel region.

Figure 12:
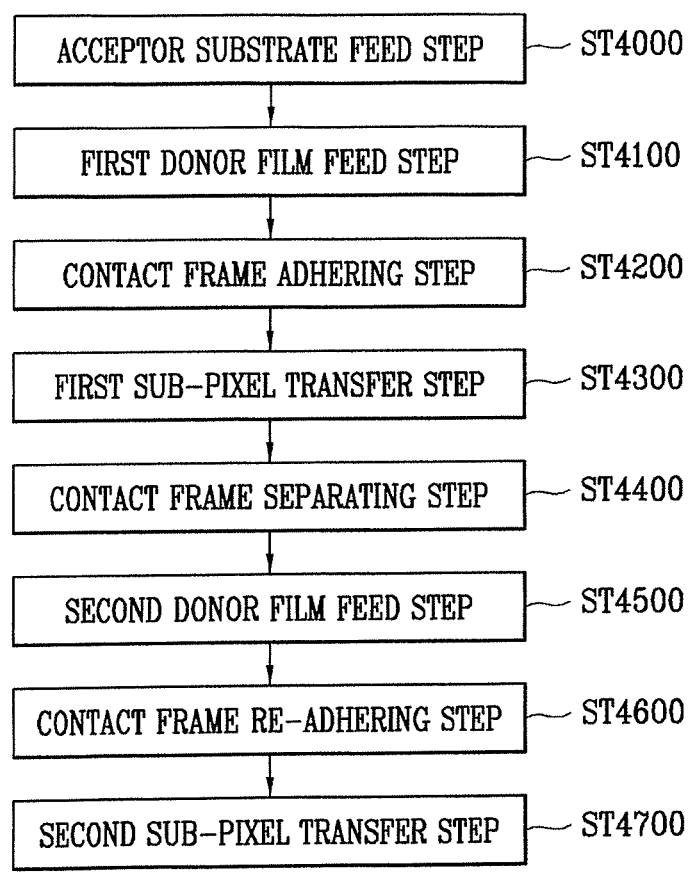
FIG. 12 is a flow diagram that illustrates a fabricating method of organic light emitting diodes according to the fourth embodiment of the present invention.

A method for forming organic light emitting diodes according to the fourth embodiment of the present invention will be described with reference to FIG. 2 and FIG. 12. A method for fabricating organic light emitting diodes includes an acceptor substrate feed step ST4000, a first donor film feed step ST4100, a contact frame adhering step ST4200, a first sub-pixel transfer step ST4300, a contact frame separating step ST4400, a second donor film feed step ST4500, a contact frame re-adhering step ST4600, and a second sub-pixel transfer step ST4700.

The acceptor substrate feed step ST4000 feeds the acceptor substrate 304 in which an organic light emission layer is formed on a mounting groove 450 of the substrate stage 110 having magnets or magnetic substance. A pixel region is defined at the acceptor substrate 304. An emission layer to be transferred from the donor film 200 is formed corresponding to the pixel region. In the pixel region of the acceptor substrate 304, three sub-pixels constitute one pixel. In the sub-pixels, a part other than the first and second sub-pixel regions is a third sub-pixel region, according to the described embodiment.

The first donor film feed step ST4100 feeds a first donor film on the acceptor substrate 304. An emission layer to be transferred at the first sub-pixel region of the acceptor substrate 304 is formed at the first donor film. Here, the emission layer can be configured as one color, for example, red color.

The contact frame adhering step ST4200 adheres the contact frame 1304 to a first donor film using magnetic attraction. The contact frame 130_4 includes magnets or magnetic substance 137_4. Opening grooves 133_4 are formed at the contact frame 130_4, and a laser for transferring a first color organic light emission layer passes through the first opening grooves 133_4. In the described embodiment, a contact frame feed mechanism first feeds and adheres the contact frame 130_4 on the substrate stage 110, and then adheres it strongly using magnetic attraction between the substrate stage 110 and the contact frame 130_4.

The first sub-pixel transfer step ST4300 expands and transfers a first color organic light emission layer included in the first donor film on the first sub-pixel region of the acceptor substrate 304 by irradiating a laser on the first donor film through the opening grooves 133_4 of the contact frame 130_4. At this time, an irradiation range of the laser can be adjusted so that the laser is irradiated to only the first sub-pixel region among regions corresponding to the opening grooves.

The contact frame separating step ST4400 separates the contact frame 130a_4 from the first donor film by first separating the first contact frame 130_4 by a magnetic repulsive force, and then by raising the contact frame to an upper portion of the chamber 150 by the contact frame feed mechanism 140.

The second donor film feed step ST4500 removes the first donor film from an upper portion of the acceptor substrate 110 to an outside of the chamber 150, and feeds a second donor film on the acceptor substrate 304. Here, the second donor film includes an emission layer to be transferred at the second sub-pixel region of the acceptor substrate 130_4. The emission layer is formed to have a second color, for example, a green color.

The contact frame re-adhering step ST4600 adheres the contact frame 130_4 to a second donor film using magnetic attraction. Here, the contact frame 130_4 includes the opening grooves 133_4 through which a laser for transferring a second color organic light emission layer of the second donor film passes.

The second sub-pixel transfer step ST4700 expands and transfers a second color organic light emission layer included in the second donor film on a second sub-pixel region of the acceptor substrate 304 by irradiating a laser on the second donor film through the opening grooves 133_4 of the contact frame 130_4. At this time, an irradiation range of the laser can be adjusted so that the laser is irradiated to only the second sub-pixel region among regions corresponding to the opening grooves 133_4.

As described earlier, after organic light emission layers of the first and second sub-pixels are formed, the acceptor substrate 304 is fed in a deposition chamber, so that an organic light emission layer of third sub-pixels can be formed. Here, the organic light emission layer of the third sub-pixels can be formed at the pixel region in common by thermal deposition. In the described embodiment, the third sub-pixels are blue.

In the described embodiment, the aforementioned steps are performed in a vacuum chamber 150, and a laser irradiation method can vary according to an arrangement of organic light emission layers to be transferred in respective transfer steps. For example, the first to third sub-pixels form a 1×3 matrix, and constitutes one pixel, and the first color organic light emission layer is transferred to be formed in a first row and a first column, and the second color organic light emission layer is transferred to be formed in the first row and a second column.

Embodiment 5

Figure 13A:
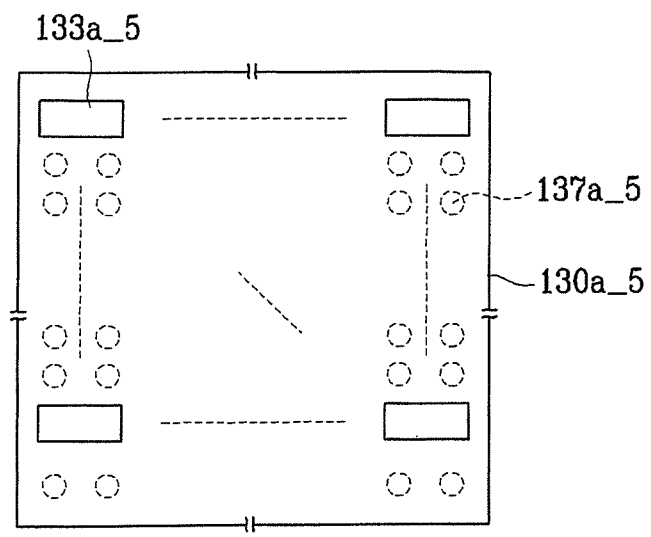
FIG. 13A and FIG. 13B are plan views respectively showing one example of a first contact frame and one example of a second contact frame according to a fifth embodiment of the present invention.
Figure 13B:
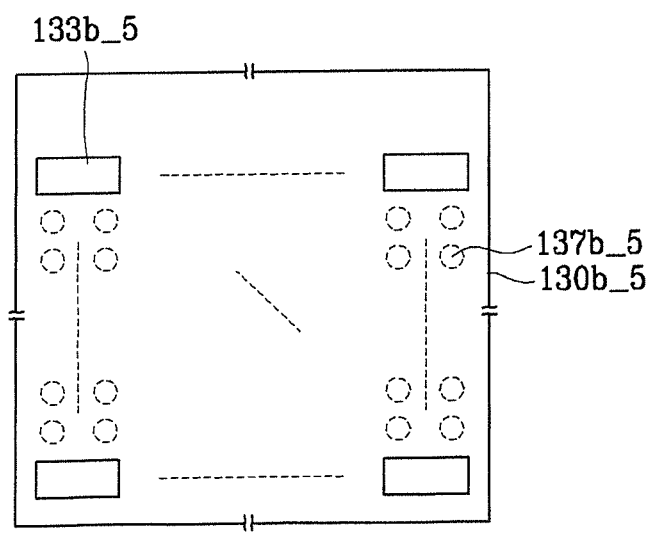
Figure 13C:
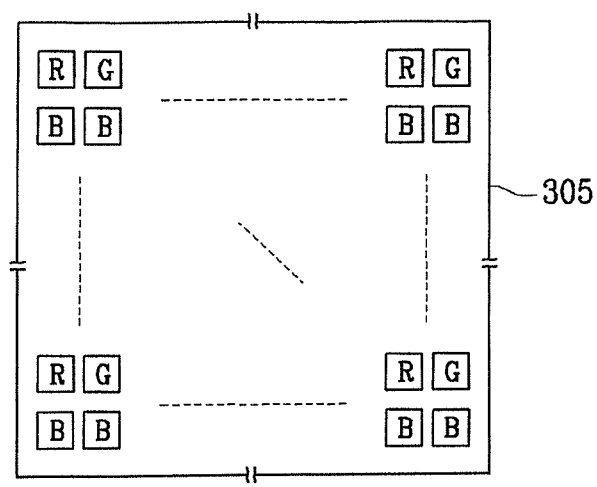
FIG. 13C is a plan view showing a pixel array of organic light emitting diodes formed by the first and second contact frames shown in FIGS. 13A and 13B.

Hereinafter, like or the same elements in the fourth embodiment are designated by like or the same numbers as are used in the first embodiment. Since an acceptor substrate and contact frames differ from those of the first embodiment, only the acceptor substrate and the contact frames will be described in detail. FIG. 13A and FIG. 13B are plan views showing one example of a first contact frame 130a_5 and one example of a second contact frame 130b_5 according to a fifth embodiment of the present invention, respectively. FIG. 13C shows a pixel array formed using the first and second contact frames 130a_5 and 130b_5 on an acceptor substrate 305.

A plurality of opening grooves 133a_5 are formed at the first contact frame 130a_5 of FIG. 13A, and first sub-pixels and second sub-pixels are formed corresponding to the opening grooves 133a_5. A plurality of opening grooves 133b_5 are formed at the second contact frame 130b_5 of FIG. 13B. When the second contact frame 130b_5 is overlapped with the first contact frame 130a_5, two third sub-pixels positioned at a lower portion of the opening grooves 133a_5 of the first contact frame 130a_5, are formed corresponding to the opening grooves 133b_5. Each contact frame includes magnets or magnetic substance 137a_5 or 137b_5. FIG. 13C shows a pixel array of an acceptor substrate corresponding to the first and second contact frames 130a_5 and 130b_5.

Figure 13D:
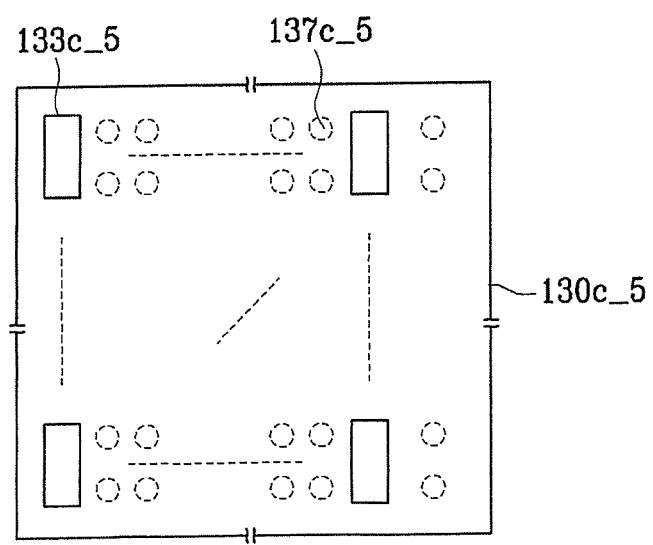
FIG. 13D and FIG. 13E are plan views respectively showing another example of a first contact frame and another example of a second contact frame according to the fifth embodiment of the present invention.
Figure 13E:
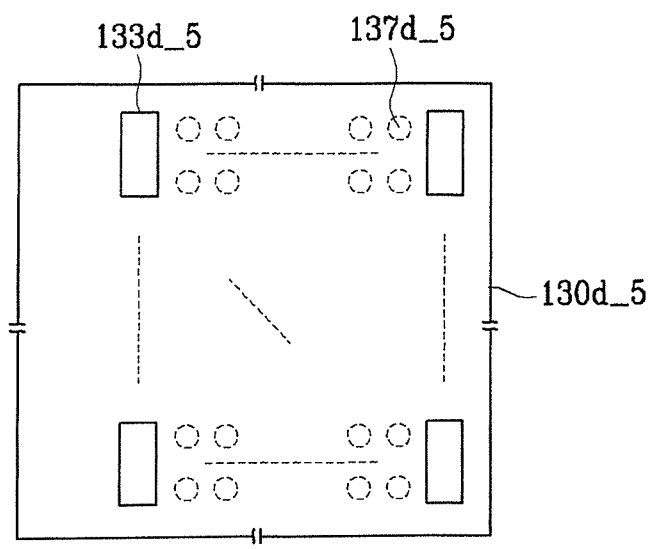
Figure 13F:
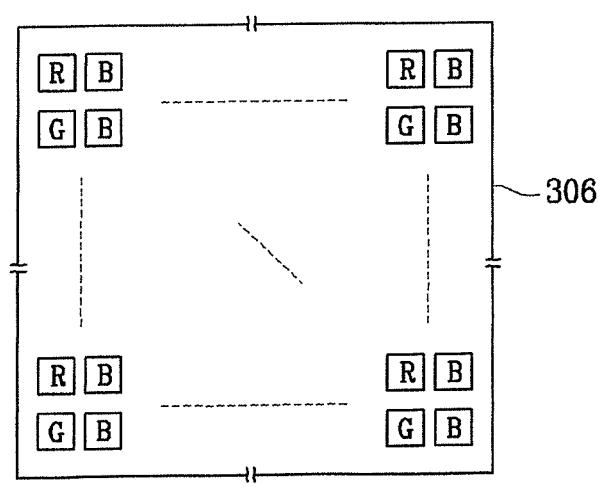
FIG. 13F is a plan view showing a pixel array of organic light emitting diodes formed by the first and second contact frames shown in FIGS. 13D and 13E.

FIGS. 13D and 13E show another embodiment of the first and second contact frames, which are alternately mounted. FIG. 13F shows a pixel array formed by the first contact frame 130d_5 and the second contact frame 130e_5. A plurality of opening grooves 133d_5 are formed at the first contact frame 130d_5 of FIG. 13D, and first sub-pixels and second sub-pixels are formed corresponding to the opening grooves 133d_5. A plurality of opening grooves 133e_5 are formed at the second contact frame 130e_5 of FIG. 13E. Using the second contact frame 130e_5 and the first contact frame 130d_5, two third sub-pixels positioned at a left side of the first contact frame 130d_5, are formed corresponding to the opening grooves 133d_5. Each contact frame includes magnets or magnetic substance 137d_5 or 137e_5. FIG. 13F shows a pixel array of an acceptor substrate fabricated using the first and second contact frames 130d_5 and 130e_5.

Figure 14:
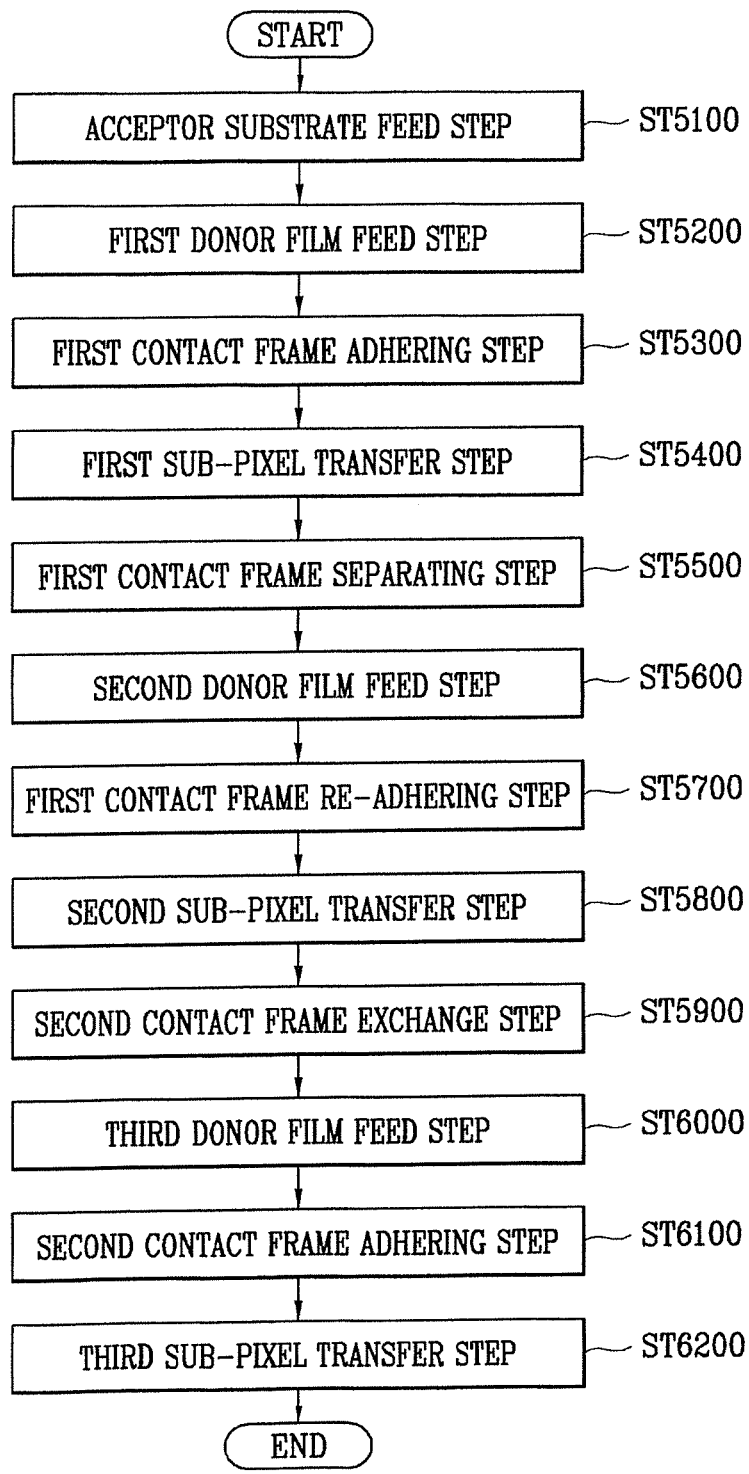
FIG. 14 is a flow diagram that illustrates a fabricating method of organic light emitting diodes according to the fifth embodiment of the present invention.

A method for forming organic light emitting diodes according to the fifth embodiment of the present invention will be described with reference to FIG. 2 and FIG. 14. A method for fabricating organic light emitting diodes having an emission layer formed between electrodes by the laser induced thermal imaging apparatus includes an acceptor substrate feed step ST5100, a first donor film feed step ST5200, a first contact frame adhering step ST5300, a first sub-pixel transfer step ST5400, a first contact frame separating step ST5500, a second donor film feed step ST5600, a first contact frame re-adhering step ST5700, a second sub-pixel transfer step ST5800, a second contact frame exchange step ST5900, a third donor film feed step ST6000, a second contact frame adhering step ST6100, and a third sub-pixel transfer step ST6200.

The acceptor substrate feed step ST5100 feeds the acceptor substrate 305 or 306 in which an organic light emission layer is formed on the substrate stage 110 having magnets or magnetic substance. A pixel region is defined at the acceptor substrate 305 or 306. An emission layer to be transferred is formed corresponding to the pixel region. The pixel region of the acceptor substrate 305 or 306 is formed so that four sub-pixels constitute one pixel.

The first donor film feed step ST5200 feeds a first donor film having an emission layer to be transferred on the acceptor substrate 305 or 306. Here, the emission layer can be configured as one color, for example, red color.

The first contact frame adhering step ST5300 adheres the first contact frame to a first donor film using magnetic attraction. The first contact frame includes magnets or magnetic substance. First opening grooves are formed at the first contact frame, and a laser for transferring a first color organic light emission layer passes through the first opening grooves. Here, a contact frame feed mechanism first feeds and adheres the first contact frame on the substrate stage, and then adheres it strongly using magnetic attraction.

The first sub-pixel transfer step ST5400 expands and transfers a first color organic light emission layer included in the first donor film on a first sub-pixel region of the acceptor substrate by irradiating a laser on the first donor film through the first opening grooves of the first contact frame. At this time, an irradiation range of the laser can be adjusted so that the laser is irradiated to only the first sub-pixel region among regions corresponding to the opening grooves.

The first contact frame separating step ST5500 separates the first contact frame from the first donor film by first separating the first contact frame by a magnetic repulsive force, and then by raising the contact frame to an upper portion of the chamber by the contact frame feed mechanism.

The second donor film feed step ST5600 removes the first donor film from an upper portion of the acceptor substrate to an outside of the chamber, and feeds a second donor film having a second color organic light emission layer on the acceptor substrate. That is, the donor film feed mechanism substitutes a second donor film for the first donor film.

The first contact frame re-adhering step ST5700 again adheres the first contact frame separated from the donor film in step ST5500 to a second donor film using magnetic attraction. Here, the contact frame feed mechanism first feeds and adheres the first contact frame on the substrate stage, and then adheres it strongly using magnetic attraction.

The second sub-pixel transfer step ST5800 expands and transfers a second color organic light emission layer included in the second donor film on a second sub-pixel region of the acceptor substrate by irradiating a laser on the second donor film through the opening grooves of the first contact frame. At this time, an irradiation range of the laser can be adjusted so that the laser is irradiated to only the second sub-pixel region among regions corresponding to the opening grooves.

The second contact frame exchange step ST5900 eliminates a magnetic force or generates a magnetic repulsive force between the first contact frame and the substrate stage to separate the first contact frame from the second donor film, and then substitutes the second contact frame for the first contact frame. The second contact frame has magnets or magnetic substance. Opening grooves are formed at the second contact frame and a laser for transferring a third color organic light emission layer of the third donor film passes through the opening grooves.

The third donor film feed step ST6000 removes the second donor film from an upper portion of the acceptor substrate to an outside of the chamber, and feeds a third donor film having a third color organic light emission layer on the acceptor substrate. That is, the donor film feed mechanism substitutes a third donor film for the second donor film.

The third contact frame adhering step ST6100 adheres the second contact frame to the third donor film using magnetic attraction. The second contact frame includes magnets or magnetic substance. Second opening grooves are formed at the second contact frame, and a laser for transferring a third color organic light emission layer passes through the third opening grooves. Here, a contact frame feed mechanism first feeds and adheres the second contact frame on the substrate stage, and then adheres it strongly using magnetic attraction.

The third sub-pixel transfer step ST6200 expands and transfers a third color organic light emission layer included in the third donor film on a third sub-pixel region of the acceptor substrate by irradiating a laser on the third donor film through opening grooves of the second contact frame. At this time, an irradiation range of the laser can be adjusted so that the laser is irradiated to an entire region of the second contact frame.

An organic light emission layer can be variously transferred at a pixel definition region in respective transfer steps. A laser irradiation method can vary according to an arrangement of a transfer. For example, the four sub-pixels form a 2×2 matrix, and constitutes one pixel, the first color organic light emission layer is transferred to be formed at an upper left end of the pixel in the first sub-pixel transfer step ST5400, and the second color organic light emission layer is transferred to be formed at a left side of the first sub-pixel in the second sub-pixel transfer step ST5800, and the third color organic light emission layer is transferred to be formed under the first and second sub-pixels in the third sub-pixel transfer step ST6200. Further, the first color organic light emission layer is transferred to be formed at an upper left end of the pixel in the first sub-pixel transfer step ST5400, and the second color organic light emission layer is transferred to be formed under the first sub-pixel in the second sub-pixel transfer step ST5800, and the third color organic light emission layer is transferred to be formed at each right side of the first and second sub-pixels in the third sub-pixel transfer step ST6200.

In the described embodiment, a color defining two sub-pixels is blue. For example, a color of the first color organic light emission layer transferred in the first sub-pixel transfer step ST5400 is red, a color of the second color organic light emission layer transferred in the second sub-pixel transfer step ST5800 is green, and a color of the first color organic light emission layer transferred in the third sub-pixel transfer step ST6200 is blue. Alternatively, a color of the first color organic light emission layer transferred in the first sub-pixel transfer step ST5400 may be green, a color of the second color organic light emission layer transferred in the second sub-pixel transfer step ST5800 may be red, and a color of the third color organic light emission layer transferred in the third sub-pixel transfer step ST6200 is blue.

Embodiment 6

Hereinafter, since an acceptor substrate and contact frames differ from those of the first embodiment, only the acceptor substrate and the contact frames will be described in detail.

Figure 15A:
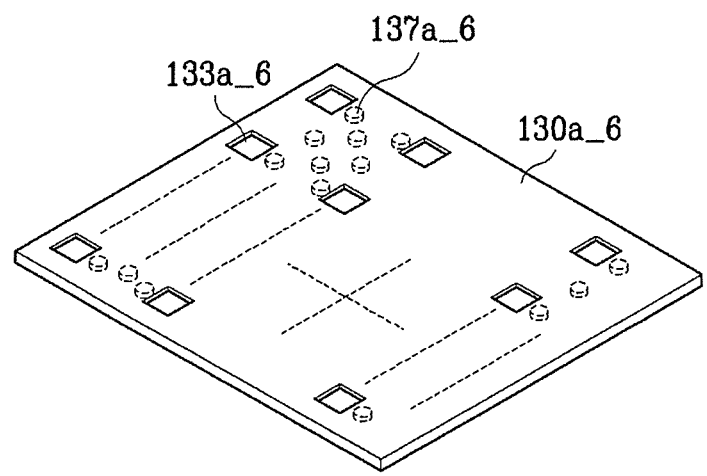
FIG. 15A, FIG. 15B and FIG. 15C are plan views respectively showing one example of a first contact frame, one example of a second contact frame, and one example of a third contact frame according to a sixth embodiment of the present invention.
Figure 15B:
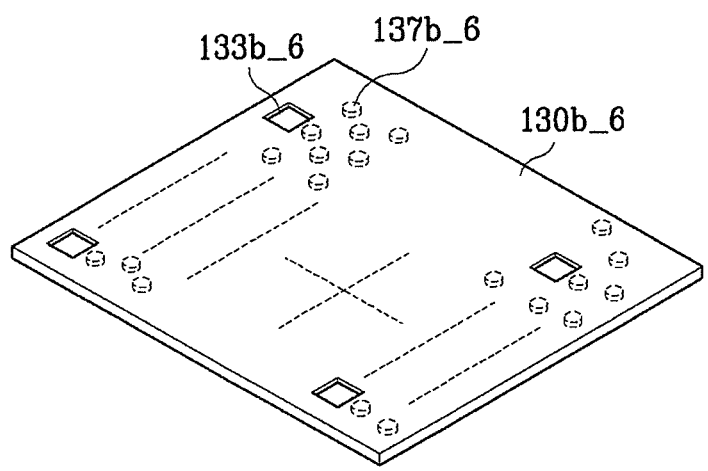
Figure 15C:
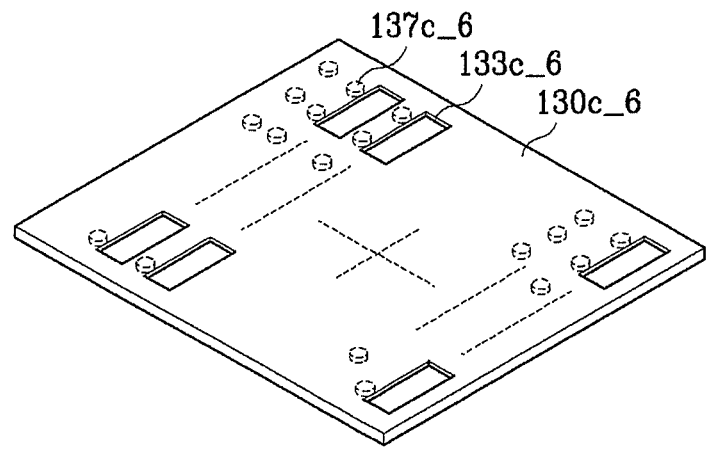

FIG. 15A, FIG. 15B and FIG. 15C are plan views showing one example of a first contact frame, one example of a second contact frame, and one example of a third contact frame according to a sixth embodiment of the present invention, respectively.

Referring to FIGS. 15A-15C, each of the first to third contact frames 130a_6, 130b_6, and 130c_6 includes at least one of a permanent magnet, magnetic substance, or an electromagnet 137a_6, 137b_6 or 137c_6, and at least one of opening grooves 133a_6, 133b_6, or 133c_6. The permanent magnet, the magnetic substance, or the electromagnet is provided at the first to third contact frames 130a_6, 130b_6, and 130c_6, and forms a magnetic force with a magnet 113 of a substrate stage 110 shown in FIGS. 3A and 3B. The permanent magnet, the magnetic substance, or the electromagnet is positioned between the opening grooves 133a_6, 133b_6, or 133c_6. Here, the magnetic substance includes ferromagnetic substance and/or weak magnetic substance. In the described embodiment, the magnetic substance is formed by one selected from the group consisting of Fe, Ni, Cr, $Fe_2O_3$, $Fe_3O_4$, $CoFe_2O_4$, magnetic nano particle, and a mixture thereof. When the magnet is an electromagnet, an electric wiring should be further formed at each electromagnet.

The opening grooves 133a_6, 133b_6, or 133c_6 can be variously set according to a pixel array having an organic light emission layer to be transferred. When a first sub-pixel, a second sub-pixel, and two third sub-pixels arranged in a 2×2 matrix constitute one pixel, and a plurality of pixels constitute a pixel portion, as shown in FIG. 15A, the first contact frame 130a_6 includes opening grooves 133a_6 at formation positions of the first sub-pixels. As shown in FIG. 15B, the second contact frame 130b_6 includes opening grooves 133b_6 at formation positions of the second sub-pixels. As shown in FIG. 15C, the third contact frame 130c_6 includes common opening grooves 133c_6 at formation positions of the two third sub-pixels. The opening grooves 133c_6 of the third contact frame 130c_6 are formed so that the third sub-pixels are positioned on the same line. The opening grooves 133a_6, 133b_6, and 133c_6 of the first to third contact frames 130a_6, 130b_6, and 130c_6 are formed so that they are not overlapped with each other when the first to third contact frames 130a_6, 130b_6, and 130c6 are overlapped with each other. In the described embodiment, the first, second, and third sub-pixels are red, green, and blue, respectively. However, the present invention is not limited thereto. In this case, each of the first to third contact frames 130a_6, 130b_6, and 130c_6 also functions as a mask to form the first to third sub-pixels.

Figure 15D:
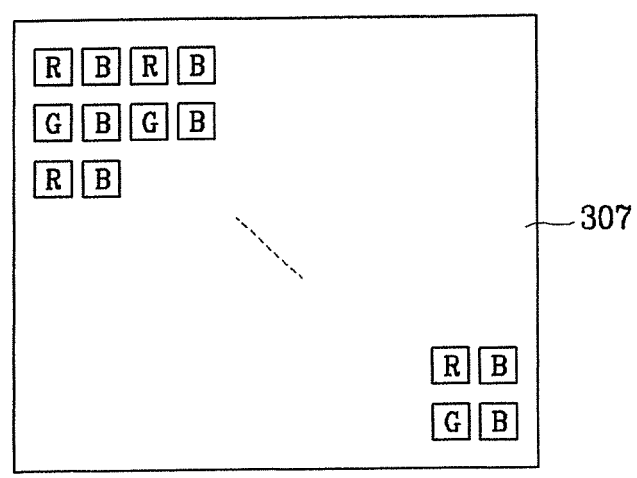
FIG. 15D is a plan view showing a pixel array of an organic light emitting diode formed by the first, second, and third contact frames shown in FIGS. 15A, 15B and 15C.

Referring to FIG. 15D showing a pixel array of an organic light emitting display device having an emission layer formed on an acceptor substrate 307 by the first to third contact frames 130a_6, 130b_6, and 130c_6, a pixel portion includes a plurality of pixels, each of which is configured by one first sub-pixel, one second sub-pixel, and two third sub-pixels. In the pixel, the first to third sub-pixels are arranged in a 2×2 matrix. The first sub-pixel is positioned at a first row and a first column, the second sub-pixel is positioned at a second row and a first column, and the two third sub-pixels are positioned at a second column. In the described embodiment, the first to third sub-pixels are red, green, and blue, respectively. In another embodiment, when the first one sub-pixel, the second one sub-pixel, and the two third sub-pixels are arranged in a 2×2 matrix, the two third sub-pixels can be at the second row. In this case, as shown in FIGS. 15E, 15F and 15G, the laser induced thermal imaging apparatus includes first to third contact frames 130e_6, 130f_6 and 130g_6.

Figure 15E:
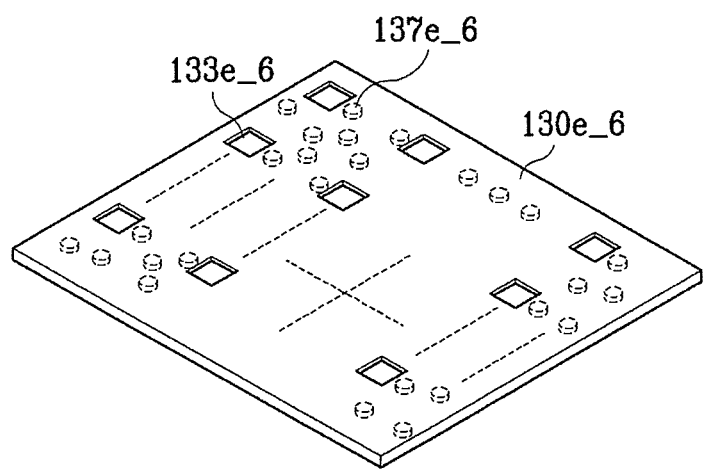
FIG. 15E, FIG. 15F and FIG. 15G are plan views respectively showing another example of a first contact frame, another example of a second contact frame, and another example of a third contact frame according to the sixth embodiment of the present invention.
Figure 15F:
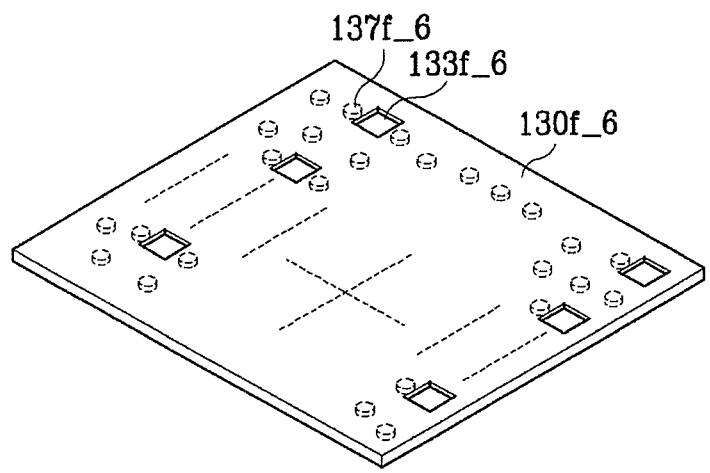
Figure 15G:
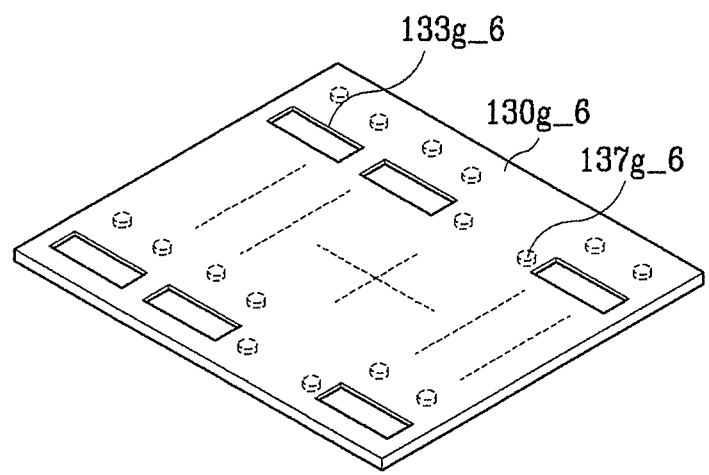
Figure 15H:
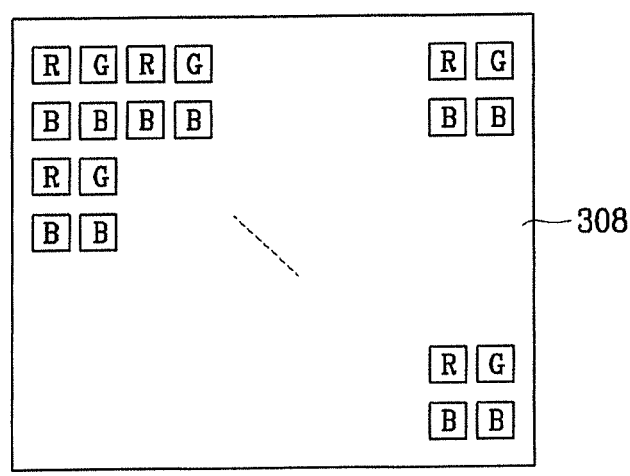
FIG. 15H is a plan view showing a pixel array of an organic light emitting diode formed by the first, second, and third contact frames shown in FIGS. 15E, 15F and 15G.

As shown in FIG. 15E, the opening grooves 133e_6 are formed at formation positions of the first sub-pixels in the first contact frame 130e_6. As shown in FIG. 15F, the opening grooves 133f_6 are formed at formation positions of the second sub-pixels in the second contact frame 130f_6. As shown in FIG. 15G, the opening grooves 133g_6 are formed at formation positions of the two third sub-pixels in the third contact frame 130g_6. The opening grooves 133g_6 of the third contact frame 130g_6 are formed so that the third sub-pixels are positioned at the same row. In other words, as shown in FIG. 15H, the first sub-pixel is positioned at a first row and a first column, the second sub-pixel is positioned at a first row and a second column, and the third sub-pixels are positioned at the second row. In the described embodiment, the first to third sub-pixels are red, green, and blue, respectively.

When one red sub-pixel, one green sub-pixel, and two blue sub-pixels constitute one pixel, by compensating emission efficiency of the blue sub-pixels having the lowest emission efficiency, a balance of respective sub-pixels can be adjusted and a color reproducibility may be increased.

Moreover, when respective sub-pixels are formed using different contact frames, opening grooves are formed at only formation positions of the same color sub-pixels in the same contact frame. This case has more parts including magnets or magnetic substance in comparison with a case that opening grooves corresponding to sub-pixels of two or more colors are formed at one contact frame, and a laminating effect due to a magnetic force is increased.

Figure 16:
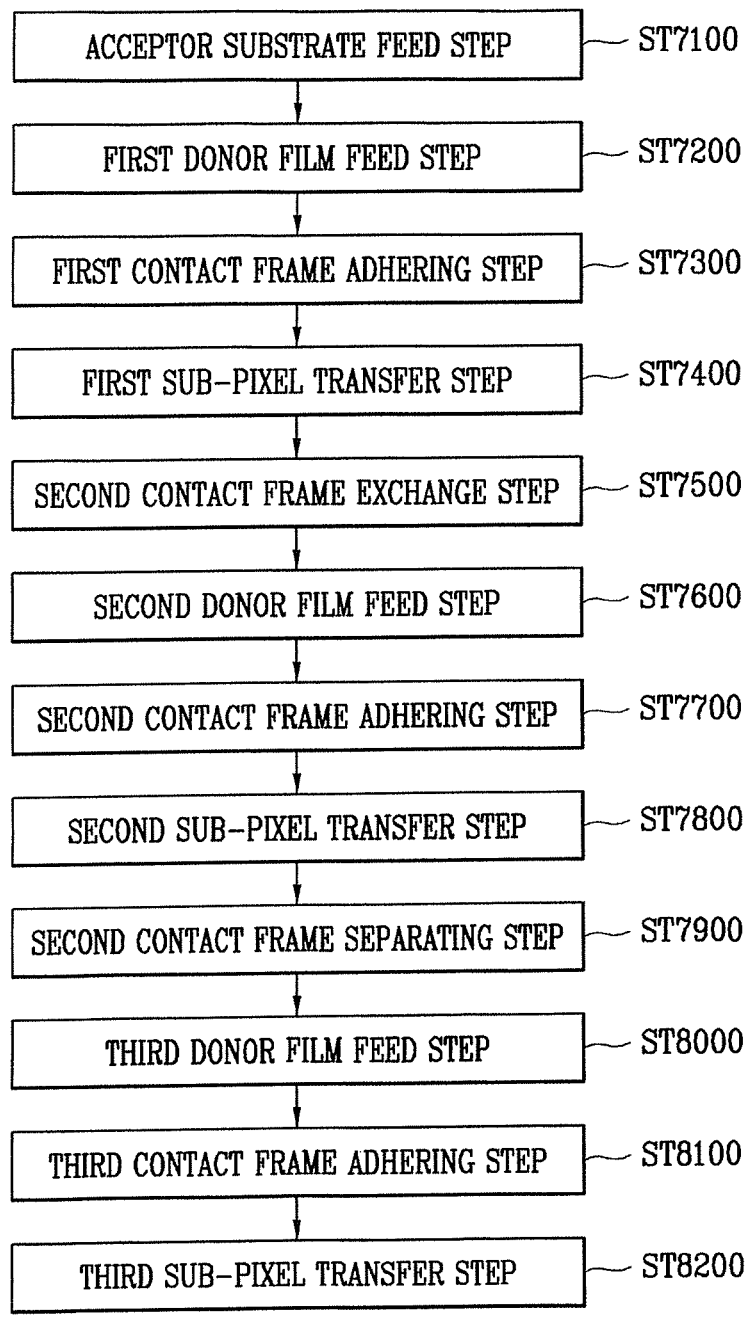
FIG. 16 is a flow diagram that illustrates a fabricating method of organic light emitting diodes according to the sixth embodiment of the present invention.

FIG. 16 is a flow diagram that illustrates a fabricating method of organic light emitting diodes according to the sixth embodiment of the present invention. A fabricating method of the organic light emitting diodes of FIG. 16 will be described in reference to fabricating one pixel of an organic light emitting display device. Each pixel of the organic light emitting display device includes first to third sub-pixels, and an emission layer included in respective sub-pixels is formed by a laser induced thermal imaging process.

With reference to FIG. 16, a laser induced thermal imaging method for forming a pixel of organic light emitting diodes by the laser induced thermal imaging apparatus according to an embodiment of the present invention includes an acceptor substrate feed step ST7100, a first donor film feed step ST7200, a first contact frame adhering step ST7300, a first sub-pixel transfer step ST7400, a second contact frame exchange step ST7500, a second donor film feed step ST7600, a second contact frame adhering step ST7700, a second sub-pixel transfer step ST7800, a second contact frame separating step ST7900, a third donor film feed step ST8000, a third contact frame adhering step ST8100, and a third sub-pixel transfer step ST8200.

Hereinafter, a laser induced thermal imaging method will be illustrated with reference to FIG. 16 and FIG. 2 showing a perspective view of the laser induced thermal imaging apparatus.

The acceptor substrate feed step ST7100 feeds an acceptor substrate 307 or 308 in a first mounting groove 450 of a substrate stage 110 having magnets or magnetic substance. An organic light emission layer is formed at the acceptor substrate 307 or 308. A pixel region is defined at the acceptor substrate 307 or 308. An emission layer to be transferred from the donor film 200, is formed corresponding to the pixel region. One first sub-pixel, one second sub-pixel, and two third sub-pixels are arranged at the pixel region of the acceptor substrate 307 or 308 in a 2×2 matrix, and constitute one pixel.

The first donor film feed step ST7200 feeds the first donor film on the acceptor substrate 307 or 308. Here, the first donor film includes an emission layer to be transferred at the first sub-pixel region of the acceptor substrate 307 or 308. At this time, the emission layer can be configured as a first color, for example, a red color.

The first contact frame adhering step ST7300 adheres the first contact frame 130a_6 to the first donor film using magnetic attraction. The first contact frame 130a_6 includes magnets or magnetic substance 137a_6. Opening grooves 133a_6 are formed at the first contact frame 130a_6, and a laser for transferring a first color organic light emission layer passes through the opening grooves. In the described embodiment, a contact frame feed mechanism first feeds and adheres the first contact frame 130a_6 on the substrate stage 110, and then adheres it strongly using magnetic attraction between the substrate stage 110 and the first contact frame 130a_6.

The first sub-pixel transfer step ST7400 expands and transfers a first color organic light emission layer included in the first donor film on a first sub-pixel region of the acceptor substrate 307 or 308 by irradiating a laser from a laser oscillator 120 on the first donor film through the first opening grooves of the first contact frame 130a_6. At this time, an irradiation range of the laser can be adjusted so that the laser is irradiated to only the first sub-pixel region among regions corresponding to the opening grooves.

The second contact frame exchange step ST7500 eliminates a magnetic force or generates a magnetic repulsive force between the first contact frame 130a_6 and the substrate stage 220 to separate the first contact frame 130a_6 from the first donor film, and then substitutes the second contact frame 130b_6 for the first contact frame 130a_6. The second contact frame 130b_6 has magnets or magnetic substance. Opening grooves 133b_6 are formed at the second contact frame 130b_6 and a laser for transferring a second color organic light emission layer of the second donor film passes through the opening grooves.

The second donor film feed step ST7600 removes the first donor film from an upper portion of the acceptor substrate 307 or 308 to an outside of the chamber 150, and feeds a second donor film on the acceptor substrate 307 or 308. The second donor film includes an emission layer to be transferred at the second sub-pixel region of the acceptor substrate 307 or 308. At this time, the emission layer can be configured as a second color, for example, a green color.

The second contact frame adhering step ST7700 adheres the second contact frame 130b_6 to the second donor film using magnetic attraction.

The second sub-pixel transfer step ST7800 expands and transfers a second color organic light emission layer included in the second donor film on the second sub-pixel region of the acceptor substrate 307 or 308 by irradiating a laser from the laser oscillator 120 on the second donor film through the opening grooves 133b_6 of the second contact frame 130b_6.

The second contact frame separating step ST7900 eliminates a magnetic force or generates a magnetic repulsive force between the second contact frame 130b_6 and the substrate stage 110 to separate the second contact frame 130b_6 from the second donor film, and then substitutes the third contact frame 130c6 for the second contact frame 130b_6. The third contact frame 130c_6 has magnets or magnetic substance. Opening grooves are formed at the third contact frame 130c_6 and a laser for transferring a third color organic light emission layer of the third donor film passes through the opening grooves.

The third donor film feed step ST8000 removes the second donor film from an upper portion of the acceptor substrate 307 or 308 to an outside of the chamber 150, and feeds a third donor film on the acceptor substrate 307 or 308. The third donor film includes an emission layer to be transferred at the third sub-pixel region of the acceptor substrate 307 or 308. In the described embodiment, the emission layer can be configured as a third color, for example, a blue color.

The third contact frame adhering step ST8100 adheres the third contact frame 130c_6 to the third donor film using magnetic attraction.

The third sub-pixel transfer step ST8200 expands and transfers a third color organic light emission layer included in the third donor film on the third sub-pixel region of the acceptor substrate 307 or 308 by irradiating a laser from the laser oscillator 120 on the third donor film through the opening grooves of the third contact frame 130c_6.

The steps can be performed in a process chamber 150, and a laser irradiation method can vary according to an arrangement of an organic light emission layer to be transferred in respective transfer steps. For example, when one first sub-pixel, one second sub-pixel, and two third sub-pixels arranged in a 2×2 matrix constitute one pixel, a laser is irradiated to form the first sub-pixel at a first row and a first column in the first sub-pixel transfer step ST7400. Further, the laser is irradiated to form the second sub-pixel at a first row and a second column in the second sub-pixel transfer step ST7800, and the laser is irradiated to form the two third sub-pixels at a second row and a first column in the third sub-pixel transfer step ST8200. Alternatively, the laser may be irradiated to form the first sub-pixel at a first row and a first column in the first sub-pixel transfer step ST7400, the laser may be irradiated to form the second sub-pixel at a second row and a first column in the second sub-pixel transfer step ST7800, and the laser may be irradiated to form the two third sub-pixels at a first row and a second column, and the second row and the second column in the third sub-pixel transfer step ST8200. In the described embodiment, the first and second sub-pixels are red and green, respectively, and the two third sub-pixels are blue.

Although certain exemplary embodiments of the present invention have been shown and described, it would be appreciated by those skilled in the art that changes might be made in these embodiments without departing from the principles or spirit of the invention, the scope of which is defined in the claims and their equivalents. For example, even when the pixel array is a mosaic or stripe type, as in the third embodiment, an organic light emission layer may be formed by two contact frames. Furthermore, it would be appreciated by those skilled in the art that changes may be made when at least three sub-pixels form one pixel.

What is claimed is:

1. A method for fabricating organic light emitting diodes, each organic light emitting diode having an emission layer formed between first and second electrodes, the method comprising:

using a laser induced thermal imaging apparatus comprising:
a substrate stage including a magnet or magnetic substance, the substrate stage being adapted to receive an acceptor substrate and a donor film to be laminated to each other on the substrate stage, the acceptor substrate having a pixel region for forming pixels, each pixel comprising a first sub-pixel, a second sub-pixel, and two third sub-pixels, the donor film having an organic light emission layer to be transferred to the pixel region;
a laser oscillator for irradiating a laser to the donor film;
a contact frame adapted to be disposed between the substrate stage and the laser oscillator, and adapted to form a magnetic force with the substrate stage, and including an opening through which the laser passes; and a contact frame feed mechanism for moving the contact frame in a direction of the substrate stage, wherein the contact frame includes first and second frames, first and second openings are formed respectively at the first and second frames, the first and second sub-pixels are formed corresponding to the first opening, and two third sub-pixels are formed corresponding to the second opening, wherein the first and second frames are alternately mounted to form emission layers of organic light emitting diodes corresponding to the first, second and third sub-pixels, wherein the contact frame comprises a first contact frame and a second contact frame, and the donor film comprises a first donor film having a first color organic light emission layer, a second donor film having a second color organic light emission layer, and a third donor film having a third color organic light emission layer, placing the acceptor substrate on the substrate stage having a magnet, the acceptor substrate having the pixel region comprising a first sub-pixel region for forming the first sub-pixel, a second sub-pixel region for forming the second sub-pixel, and two third sub-pixel regions for forming the two third sub-pixels, wherein one pixel comprises one first sub-pixel, one second sub-pixel and two third sub-pixels;

placing the first donor film having the first organic light emission layer on the acceptor substrate;

adhering the first contact frame having a magnet to the first donor film using magnetic attraction, the first contact frame having an opening;

irradiating the laser to the first donor film through the opening of the first contact frame to transfer the first color organic light emission layer to the first sub-pixel region;

separating the first contact frame from the first donor film;

placing the second donor film having the second color organic light emission layer on the acceptor substrate;

adhering the first contact frame to the second donor film using magnetic attraction;

irradiating the laser to the second donor film through the opening of the first contact frame to transfer the second color organic light emission layer to the second sub-pixel region;

separating the first contact frame from the second donor film, and substituting the first contact frame with the second contact frame, the second contact frame including a magnet, and having an opening;

placing the third donor film having the third color organic light emission layer on the acceptor substrate;

adhering the second contact frame to the third donor film using magnetic attraction; and irradiating the laser on the third donor film through the opening of the second contact frame to transfer the third color organic light emission layer to the two third sub-pixel regions.

2. The method according to claim 1, wherein the four sub-pixels of one pixel form a 2×2 matrix, wherein the first color organic light emission layer is transferred to form the first sub-pixel at an upper left corner of the pixel, the second color organic light emission layer is transferred to form the second sub-pixel at a right side of the first sub-pixel, and the third color organic light emission layer is transferred to form the two third sub-pixels under the first and second sub-pixels.

3. The method according to claim 1, wherein the four sub-pixels of one pixel form a 2×2 matrix, wherein the first color organic light emission layer is transferred to form the first sub-pixel at an upper left corner of the pixel, the second color organic light emission layer is transferred to form the second sub-pixel under the first sub-pixel, and the third color organic light emission layer is transferred to form the two third sub-pixels at right side of the first and second sub-pixels.

4. The method according to claim 2, wherein the first color organic light emission layer is adapted to emit a red color light, the second color organic light emission layer is adapted to emit a green color light, and the third color organic light emission layer is adapted to emit a blue color light.

5. The method according to claim 2, wherein the first color organic light emission layer is adapted to emit a green color light, the second color organic light emission layer is adapted to emit a red color light, and the third color organic light emission layer is adapted to emit a blue color light.

* * * * *